United States Patent [19]
Lan et al.

[11] Patent Number: 5,767,575
[45] Date of Patent: Jun. 16, 1998

[54] BALL GRID ARRAY STRUCTURE AND METHOD FOR PACKAGING AN INTEGRATED CIRCUIT CHIP

[75] Inventors: James J. D. Lan, Fremont; Steve S. Chiang, Saratoga; Paul Y. F. Wu, San Jose, all of Calif.; William H. Shepherd, Placitas, N. Mex.; John Y. Xie, San Jose; Hang Jiang, Milpitas, both of Calif.

[73] Assignee: Prolinx Labs Corporation, San Jose, Calif.

[21] Appl. No.: 543,982

[22] Filed: Oct. 17, 1995

[51] Int. Cl.$^6$ .................................................. H01L 23/12
[52] U.S. Cl. ........................ 257/701; 257/738; 257/760
[58] Field of Search .................................. 257/701, 738, 257/746, 760, 774

[56] References Cited

U.S. PATENT DOCUMENTS

| | | | |
|---|---|---|---|
| 3,335,327 | 8/1967 | Damon et al. | |
| 3,384,879 | 5/1968 | Stahl et al. | |
| 3,615,913 | 10/1971 | Shaw | 148/33.3 |
| 3,808,576 | 4/1974 | Castonguay et al. | 338/309 |
| 3,857,683 | 12/1974 | Castonguay | 29/195 |
| 3,923,359 | 12/1975 | Newsam | 339/17 M |
| 4,090,667 | 5/1978 | Crimmins | 339/19 |
| 4,146,863 | 3/1979 | Mollenhoff | 337/296 |
| 4,238,839 | 12/1980 | Redfern et al. | 365/96 |
| 4,245,273 | 1/1981 | Feinberg et al. | 361/382 |
| 4,247,981 | 2/1981 | Walters | 29/845 |
| 4,386,051 | 5/1983 | Edgington | 420/589 |

(List continued on next page.)

FOREIGN PATENT DOCUMENTS

| | | |
|---|---|---|
| 0 336 359 | 10/1989 | European Pat. Off. |
| 510900-A2 | 10/1992 | European Pat. Off. |
| 59-13368 | 1/1984 | Japan |
| 61-287152A | 12/1986 | Japan |

OTHER PUBLICATIONS

"Matsushita Team Eliminates Holes in High–Density PCB", Tsuda, Nikkei Electronics Asia, Mar. 1995, pp. 69–70.
"An Enhanced Performance Low Cost BGA Package", Marrs, etc., Amkor Electronics, Inc., pp. 214–225.
"A Large Format Modified TEA $CO_2$ Laser Based Process for Cost Effective Small Via Generation", J.M. Morrison etc., MCM 1994 Proceedings, pp. 369–377.
"The Application of Laser Process Technology to Thin Film Packaging", T.F. Redmond etc., IEEE, 1992, pp. 1066–1071.
"A New Circuit Substrate For MCM–L", Yusuke Wada etc., ICEMCM, 1995, pp. 59–64.

(List continued on next page.)

*Primary Examiner*—Tom Thomas
*Assistant Examiner*—Roy Potter
*Attorney, Agent, or Firm*—Skjerven, Morrill, MacPherson, Franklin & Friel LLP; Alan H. MacPherson; Omkar K. Suryadevara

[57] ABSTRACT

An integrated circuit (IC) package substrate has a dielectric layer and a micro filled via formed substantially in the center of a hole in the dielectric layer. The IC package substrate has at least one chip bonding pad and one ball attach pad that are electrically coupled to each other by the micro filled via. The micro filled via is formed of a material called a "micro filled via material" that includes a binding material and optionally includes a number of particles (between 0%–90% by volume) dispersed in the binding material. The binding material can be any material, such as a polymer that is either conductive or nonconductive. The particles can be formed of any conductive material, such as a conductive polymer or a conductive metal (e.g. copper or gold). An electrical conductor can be originally formed simply by contact between conductive particles located adjacent to each other. In an optional step, the micro filled via is subjected to a programming current (in a step called "programming") to lower the resistance of an originally formed electrical conductor, or to originally form an electrical conductor by break down of a dielectric material. The IC package substrate can be formed in either a cavity up or a cavity down configuration.

38 Claims, 21 Drawing Sheets

U.S. PATENT DOCUMENTS

| | | | |
|---|---|---|---|
| 4,399,372 | 8/1983 | Tanimoto et al. | 307/279 |
| 4,413,272 | 11/1983 | Mochizuki et al. | 357/65 |
| 4,420,820 | 12/1983 | Preedy | 365/105 |
| 4,424,578 | 1/1984 | Miyamoto | 365/104 |
| 4,433,331 | 2/1984 | Kollaritsch | 340/825.83 |
| 4,455,495 | 6/1984 | Masuhara et al. | 307/44 |
| 4,458,297 | 7/1984 | Stopper et al. | 361/403 |
| 4,488,262 | 12/1984 | Basire et al. | 365/104 |
| 4,491,860 | 1/1985 | Lim | 357/68 |
| 4,507,756 | 3/1985 | McElroy | 365/104 |
| 4,507,757 | 3/1985 | McElroy | 365/104 |
| 4,547,830 | 10/1985 | Yamauchi | 361/104 |
| 4,562,639 | 1/1986 | McElroy | 29/584 |
| 4,565,712 | 1/1986 | Noguchi et al. | 427/53.1 |
| 4,566,186 | 1/1986 | Bauer et al. | 29/852 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,609,241 | 9/1986 | Peterson | 339/17 CF |
| 4,642,160 | 2/1987 | Burgess | 156/630 |
| 4,651,409 | 3/1987 | Ellsworth et al. | 29/576 B |
| 4,652,974 | 3/1987 | Ryan | 361/395 |
| 4,678,889 | 7/1987 | Yamanaka | 219/121 LJ |
| 4,689,411 | 8/1987 | Dick et al. | 174/68.5 |
| 4,700,116 | 10/1987 | Inoue et al. | 318/254 |
| 4,700,214 | 10/1987 | Johnson | 357/68 |
| 4,710,592 | 12/1987 | Kimbara | 174/68.5 |
| 4,721,868 | 1/1988 | Cornell et al. | 307/465 |
| 4,726,991 | 2/1988 | Hyatt et al. | 428/329 |
| 4,731,704 | 3/1988 | Lochner | 361/400 |
| 4,748,490 | 5/1988 | Hollingsworth | 357/51 |
| 4,757,359 | 7/1988 | Chiao et al. | 357/23.5 |
| 4,780,670 | 10/1988 | Cherry | 324/158 |
| 4,786,904 | 11/1988 | Graham, III et al. | 340/825.83 |
| 4,789,760 | 12/1988 | Koyama et al. | 174/68.5 |
| 4,791,075 | 12/1988 | Lin | 437/209 |
| 4,792,646 | 12/1988 | Enomoto | 174/68.5 |
| 4,792,835 | 12/1988 | Sacarisen et al. | 357/23.6 |
| 4,796,074 | 1/1989 | Roesner | 357/51 |
| 4,796,075 | 1/1989 | Whitten | 357/51 |
| 4,799,128 | 1/1989 | Chen | 361/414 |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. | 357/51 |
| 4,829,404 | 5/1989 | Jensen | 361/398 |
| 4,839,864 | 6/1989 | Fujishima | 365/200 |
| 4,840,924 | 6/1989 | Kinbara | 437/189 |
| 4,841,099 | 6/1989 | Epstein et al. | 174/68.5 |
| 4,845,315 | 7/1989 | Stopper | 361/428 |
| 4,847,732 | 7/1989 | Stopper et al. | 361/395 |
| 4,864,165 | 9/1989 | Hoberman et al. | 307/467 |
| 4,873,506 | 10/1989 | Gurevich | 337/290 |
| 4,874,711 | 10/1989 | Hughes et al. | 437/8 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,933,738 | 6/1990 | Orbach et al. | 357/51 |
| 4,935,584 | 6/1990 | Boggs | 174/262 |
| 4,937,475 | 6/1990 | Rhodes et al. | 307/465 |
| 4,940,181 | 7/1990 | Juskey, Jr. et al. | 228/180.2 |
| 4,943,538 | 7/1990 | Mohsen et al. | 437/52 |
| 4,949,084 | 8/1990 | Schwartz et al. | 340/825.83 |
| 4,969,124 | 11/1990 | Luich et al. | 365/201 |
| 4,974,048 | 11/1990 | Chakravorty et al. | 357/40 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 357/74 |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,087,589 | 2/1992 | Chapman et al. | 437/195 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,108,541 | 4/1992 | Schneider et al. | 156/631 |
| 5,120,679 | 6/1992 | Boardman et al. | 437/195 |
| 5,142,263 | 8/1992 | Childers et al. | 338/21 |
| 5,144,567 | 9/1992 | Oelsch et al. | 364/708 |
| 5,148,265 | 9/1992 | Khandros et al. | 357/80 |
| 5,148,355 | 9/1992 | Lowe et al. | 361/410 |
| 5,155,577 | 10/1992 | Chance et al. | 357/71 |
| 5,159,535 | 10/1992 | Desai et al. | 361/398 |
| 5,166,556 | 11/1992 | Hsu et al. | 307/465 |
| 5,170,931 | 12/1992 | Desai et al. | 228/180.2 |
| 5,181,096 | 1/1993 | Forouhi | 257/530 |
| 5,181,859 | 1/1993 | Foreman et al. | 439/225 |
| 5,189,387 | 2/1993 | Childers et al. | 338/20 |
| 5,196,724 | 3/1993 | Gordon et al. | 257/530 |
| 5,200,652 | 4/1993 | Lee | 307/465 |
| 5,216,278 | 6/1993 | Lin et al. | 257/688 |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 437/211 |
| 5,258,643 | 11/1993 | Cohen | 257/530 |
| 5,260,519 | 11/1993 | Knickerbocker et al. | 174/262 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,291,062 | 3/1994 | Higgins, III | 257/698 |
| 5,294,750 | 3/1994 | Sakai et al. | 174/52.4 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,402,318 | 3/1995 | Otsuka et al. | 257/700 |
| 5,404,637 | 4/1995 | Kawakami | 29/843 |
| 5,409,865 | 4/1995 | Karnezos | 437/210 |

| | | | |
|---|---|---|---|
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,435,480 | 7/1995 | Hart et al. | 228/180.1 |
| 5,436,412 | 7/1995 | Ahmad et al. | 174/265 |
| 5,438,166 | 8/1995 | Carey et al. | 174/261 |
| 5,464,790 | 11/1995 | Hawley | 437/60 |
| 5,468,995 | 11/1995 | Higgins, III | 257/697 |
| 5,481,795 | 1/1996 | Hatakeyama et al. | 29/852 |
| 5,487,218 | 1/1996 | Bhatt et al. | 29/852 |
| 5,502,889 | 4/1996 | Casson et al. | 29/830 |
| 5,521,332 | 5/1996 | Shikata et al. | 257/700 |
| 5,537,108 | 7/1996 | Nathan et al. | 340/825.84 |
| 5,572,409 | 11/1996 | Nathan et al. | 361/806 |
| 5,574,311 | 11/1996 | Matsuda | 257/697 |
| 5,583,376 | 12/1996 | Sickler et al. | 257/702 |
| 5,612,574 | 3/1997 | Summerfelt et al. | 257/783 |

OTHER PUBLICATIONS

"Rigid–Flex: The Old and the New", Jahn Stopperan, Shendahl, Inc., 1990, 4 pages.

"High–Performance Scalable Switch Design", Joshua Silver, ASIC & EDA, Jun. 1994, pp. 38–48.

"Dielectric Based Antifuse For Logic and Memory ICs", Esmat Hamdy et al., IEEE 1988, pp. 786–789.

"Advanced Single Poly BiCMOS Technology For High Performance Programmable TTL/ECL Applications", Ali Iranmanesh etc., IEEE Bipolar Circuits and Technology Meeting, 1990, 4 pages.

"Conducting Filament of the Programmed Metal Electrode Amorphose Silicon Antifuse", Kathryn E. Gordon etc., IEEE, 1993, pp. 27–30.

"Interconnect Devices for Field Programmable Gate Array", Chenming Hu, IEEE, 1992, pp. 591–594.

"Antifuse Structure Comparison For Field Programmable Gate Arrays", Steve Chiang etc., IEEE, 1992, pp. 611–614.

Interplay of Energies in Circuit Breaker and Fuse Combinations, Bernie DiMarco etc., IEEE, 1991, pp. 1765–1769.

"Laser Personalization of NMOS Digital Topologies", James B. Gullette etc., IEEE, 1983, pp. 1249–1252.

"I/O Buffering System to a Programmable Switching Apparatus", Wen–Jai Hsieh etc., Official Gazette, Jan. 25, 1994, one page.

"Characterizing Quickturn ASICs: It's Done With Mirrors", Ron Iscoff, Semiconductor International, Aug. 1990, 6 pages.

"An Ultra High Speed ECL Programmable Logic Device", Fred Ki etc., IEEE Bipolar Circuits and Technology Meeting, 1990, 5 pages.

"Distribution Fuses of Nearest Future", T. Lipski, 3rd International Conference on Future Trends in Distribution Switch Gear, Jul. 26, 1990, pp. 41–45.

"An Advancement in the Design and Application of Current–Limiting Fuses", R. Ranjan etc., General Electric Company, pp. 36–40.

"A Novel MOS PROM Using a Highly Resistive Poly–Si Resistor", Masafumi Tanimoto etc., IEEE, 1980, 4 pages.

"CMOS Resistive Fuse Circuits", Hae–Seung Lee etc., Dept. of Electrical Engineering and Computer Science, Massachusetts Institute of Technology, 1990, pp. 109–110.

"CMOS Resistive Fuses for Image Smoothing and Segmentation", Paul C. Yu etc., IEEE, 1992, pp. 545–553.

"Process Considerations In Restructurable VLSI For Wafer–Scale Integration", P. W. Wyatt, etc., IEDM, 1984, pp. 626–629.

"A Laser Linking Process For Restructurable VLSI", G. H. Chapman, etc., CLEO, Apr. 14–16, 1982, pp. 1–4.

"Taiyo PSR–400 Photoimageable Solder Mask (Two–Part Aqueous Developing System", Taiyo America, Inc., 1992, pp. 1–8.

"Ball Grid Array Technology", John H. Lau, McGraw–Hill, Inc., 1995, p. 38.

BALL GRID ARRAY STRUCTURE AND METHOD FOR PACKAGING AN INTEGRATED CIRCUIT CHIP

CROSS REFERENCE TO RELATED APPLICATIONS

This application is related to U.S. patent applications Ser. No. 08/194,110, filed Feb. 8, 1994, Ser. No. 08/320,145, filed Oct. 7, 1994, Ser. No. 08/374,941, filed Jan. 18, 1995, and Ser. No. 08/538,886, filed Oct. 4, 1995, all of which are incorporated herein in their entirety.

CROSS REFERENCE TO MICROFICHE APPENDIX

Microfiche Appendices A and B are parts of the present disclosure and together consist of one sheet of microfiche having 28 frames. Microfiche Appendix A consists of the first four lines on frame 1 and lists source code of a computer file entitled "WBPADGEN.BAS." Microfiche Appendix B consists of the rest of the lines on frame 1 and the rest of the frames and lists source code of a computer file entitled "WBPADGEN.TXT." Microfiche Appendices A and B together are parts of a design automation software program that is used in one embodiment of this invention, and is described below.

A portion of the disclosure of this patent document contains material which is subject to copyright protection. The copyright owner has no objection to the facsimile reproduction by anyone of the patent document or the patent disclosure, as it appears in the U.S. Patent and Trademark Office patent files or records, but otherwise reserves all copyright rights whatsoever.

FIELD OF INVENTION

This invention relates to a structure and method for packaging an integrated circuit chip. In particular, this invention relates to a ball grid array package having a dielectric layer and an electrical conductor formed at least in the center of a hole in the dielectric layer.

BACKGROUND OF THE INVENTION

A semiconductor die (also called an "integrated circuit" chip or IC chip), with electrical circuitry formed therein can be mounted on a "ball grid array" (BGA) substrate using, for example, flip chip (also called "controlled collapse chip connection") structure 111 (FIG. 1A), wire bond structure 112 or tape automated bond (TAB) structure 113 described in "Ball Grid Array Technology", edited by John H. Lau, McGraw-Hill, 1995 that is incorporated by reference herein in its entirety. See also U.S. Pat. Nos. 5,420,460, 5,409,865, 5,397,921, 4,940,181 and 5,216,278.

FIG. 1B discloses a BGA package 120 with an IC chip 128 mounted on BGA substrate 125's first side 121 using wire bond structure 112 (FIG. 1A), and an area array of solder balls 122A–122J (where J is the number of balls) attached to BGA substrate 125's second side 123. BGA substrate 125 has a number of plated vias 125A–125K (where K is the number of vias) that electrically couple IC chip 128 to solder balls 122A–122J. BGA package 120 is typically assembled independent of, and then mounted on a structure, such as a printed circuit board 126.

Lau states at page 38 of his book referenced above "[a]s the PCB technologies push themselves to smaller plated vias, better tolerances, and finer lines and spaces, this next-generation BGA can result in carriers that can theoretically be the same size as the chip in the horizontal dimensions."

Although theoretically possible, many practical difficulties preclude manufacture of such chip sized carriers or packages. For example, the size of a via in an IC package limits the number of vias that can be formed in a given area, which in turn limits the smallest possible size of the package.

The size of a via is limited by limitations of conventional methods of forming vias, such as mechanical drilling, laser drilling and photoimaging-plating methods. For example, mechanical drilling requires, in a structure being drilled, a target area (sometimes called a "land") that is larger (typically 10 to 15 mils larger) than the drill bit's size, to account for possible misalignment during drilling. In laser drilling, the laser's impact on the material is not reproducible. In a photoimaging-plating process, adhesion between a photoimageable dielectric layer and either (1) a conductive material plated in a via hole or (2) a conductive material forming a trace poses problems. These and other such practical difficulties impose significant limits on miniaturization of conventional IC packages.

SUMMARY

A ball grid array package has an electrical conductor (hereinafter "micro filled via" or "MFV") formed through a dielectric layer to electrically couple, for example, a chip bonding pad and a ball attach pad of the package. The micro filled via is formed at least in a central region of a hole in the dielectric layer and so eliminates unused space of the type typically present in the center of a conventional plated via. Moreover, the micro filled via is devoid of plated material typically present in a conventional plated via.

Use of the central region of a hole by a micro filled via allows the micro filled via to be made smaller than a conventional plated via. Specifically, the smallest possible diameter of a micro filled via is not limited by limitations of a conventional plating process used to form a plated via. For example, in one embodiment, the micro filled via has a diameter less than half the diameter of a plated via.

In one embodiment, an integrated circuit (hereinafter "IC") package has a substrate with a number of traces formed on an inner layer, and micro filled vias formed at predetermined locations connecting the inner layer traces to pads formed on an outer surface, thereby allowing the IC package to have a smaller foot print (the area covered on a printed circuit board) than a conventional IC package with the same number of pads.

Also, for a given number of pads, an IC package in accordance with this invention can have wider traces separated by a larger pitch than traces in a conventional IC package, because use of one or more inner layers multiplies the area available to form traces.

Moreover, additional area for forming traces is freed by a structure, called a "pad-on-via" structure, formed in one embodiment by covering a micro filled via with a pad or a trace. In a pad-on-via structure in accordance with this invention, the micro filled via is formed substantially in the center of a hole so that the hole does not adversely affect the planarity (i.e. deviation from a plane) of a pad or trace that contiguously (i.e. without a hole) covers the micro filled via and the hole. In one embodiment, the pad or trace of the pad-on-via structure is substantially flat locally, i.e. over the micro filled via and the corresponding hole. The planarity is sufficient to allow various layers to be formed over a pad-on-via structure or to allow a bond wire or a solder ball to be attached to a pad of a pad-on-via structure.

Micro filled vias in accordance with this invention can also be formed offset from a pad, and be connected to the pad by a trace. Moreover, micro filled vias can also be formed connected to a region predetermined for coupling to a ground or power source.

In one embodiment, the micro filled via is formed of a material called a "micro filled via" material (or "MFV" material) that includes a binding material and optionally includes a number of particles (between 0%–60% by volume) dispersed in the binding material. The binding material can be any material, such as a polymer that is either conductive or nonconductive. The particles can be formed of a conductive material, such as a conductive polymer or a conductive metal (e.g. copper, silver or gold).

An electrical conductor can be originally formed in a micro filled via simply by contact between conductive particles located adjacent to each other, especially when the MFV material is subjected to pressure e.g. during lamination of various layers to form the substrate. In an optional step, the MFV can be subjected to a programming current (in a step called "programming") to lower the resistance of an originally formed electrical conductor, or to originally form an electrical conductor by break down of a dielectric material in the micro filled via material.

DETAILED DESCRIPTION

In accordance with this invention, a ball grid array package has a number of chip bonding pads and ball attach pads supported by a dielectric layer. The dielectric layer defines one or more holes, and an electrical conductor (hereinafter "micro filled via" or "MFV") is formed at least in the center of each hole. Each micro filled via electrically couples one of the chip bonding pads to one of the ball attach pads, for example, through a trace formed in an inner layer of the package. The use of the central region of a hole allows the micro filled via to be made smaller than a conventional plated via, thereby allowing a ball grid array package of this invention to be made smaller than a conventional ball grid array package.

Figure 1A:
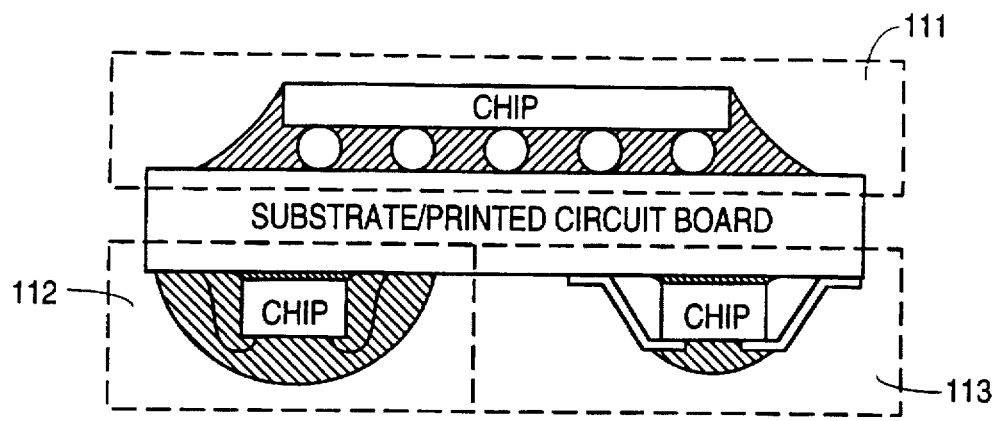
FIG. 1A illustrates, in cross-sectional views, three different conventional structures for mounting an integrated circuit chip on a ball grid array substrate.
Figure 1B:
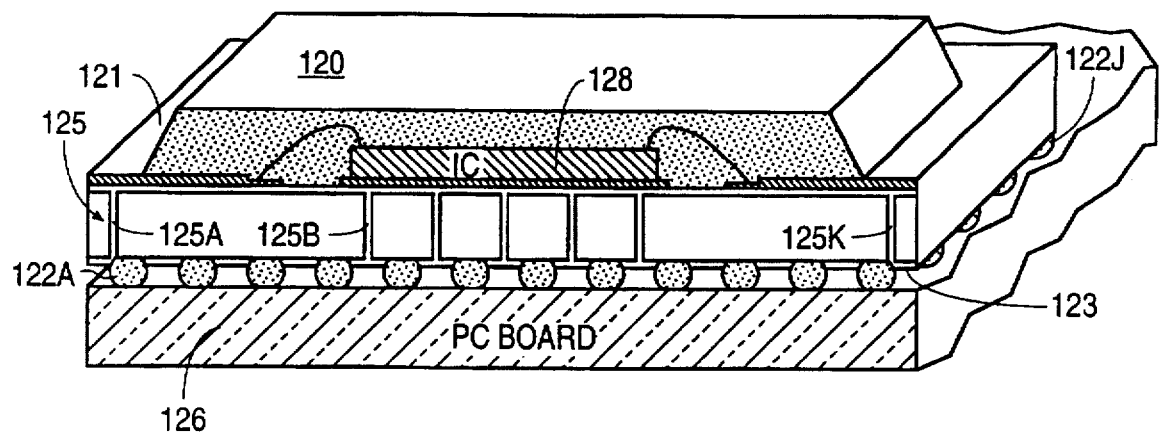
FIG. 1B illustrates, in a perspective view, a conventional ball grid array package mounted on a printed circuit board.

Although certain types of ball grid array packages are described below, other types of ball grid array packages, for example, using TAB structure 113 (FIG. 1A) or flip chip structure 111 can also be formed using micro filled vias in various embodiments of this invention. Moreover, other types of integrated circuit packages, such as a plastic pin grid array package or a ceramic pin grid array package can also be formed using micro filled vias in other embodiments of this invention.

In one embodiment, a ball grid array package 210 (FIG. 2A) has a number of solder balls 211A–211N (for clarity, not all N solder balls are labeled) arranged in a predetermined configuration for coupling with corresponding pads 201A–201N (again not all N pads are labeled) of a printed circuit board (also referred to as "PCB") 200 on which ball grid array package 210 can be surface mounted. PCB 200 has a number of traces that connect to other electronic components (not shown), such as single chip packages, multichip packages, discrete components, a source of ground reference voltage source and a source of power reference voltage.

Ball grid array (also referred to as "BGA") package 210 has a cavity down configuration, with solder balls 211A–211N located on the same side (hereinafter "contact side") 212 as an integrated circuit (also referred to as "IC") chip 213. Opposite to contact side 212, BGA package 210 has an exposed side 214 formed by a heat sink 215 that is attached by an adhesive film 216 to a substrate 217 (on which solder balls 211A–211N are mounted).

Although the following description refers to a substrate for a single BGA package, substrates for a number of BGA packages can be formed simultaneously in a panel. For example a panel of area 18"×24" can be processed as described below and routed (i.e. divided) at the end of the process (prior to mounting IC chips) into 150 substrates (each of an appropriate area e.g. 1.3"×1.3").

Substrate 217 (FIG. 2B) is formed of a stiffener 218, such as a copper sheet, for example 15 mil thick and area 18"×24". The copper sheet can be oxidized to increase the surface roughness to a level needed for lamination, as is well known in the art of IC packaging.

Figure 2A:
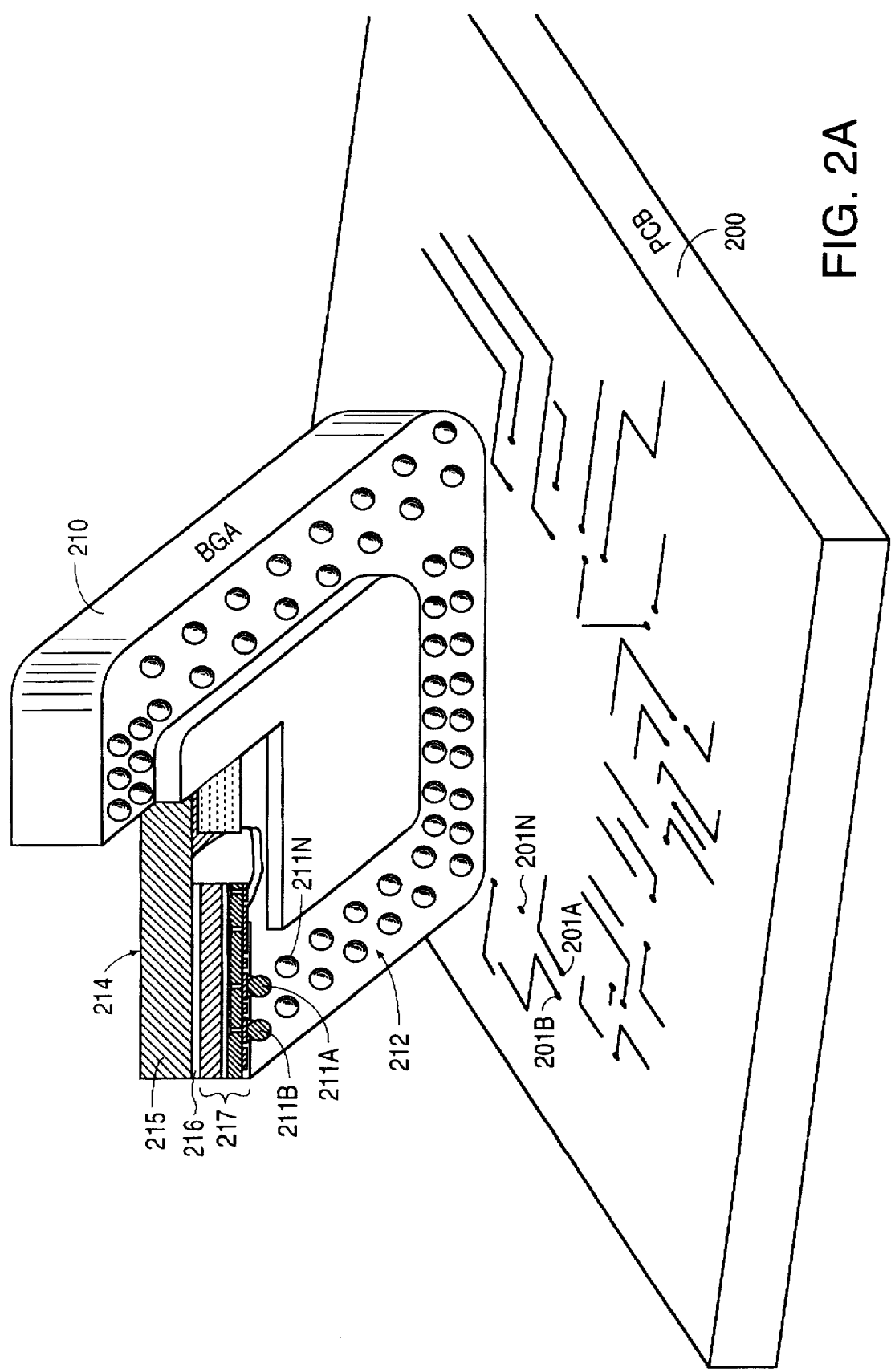
FIG. 2A illustrates, in a cut-away perspective view, one embodiment of a cavity down ball grid array package in relation to a printed circuit board.

Then, using a support layer 219 (e.g. a prepreg layer of 0.5 mil. thickness) stiffener 218 is laminated with a conductive foil (e.g. 0.7 mil thick copper foil also of the appropriate area) that is then printed and etched to form traces 220A–220P (FIG. 2C) and region 231 of an inner conductive layer 220 in a predetermined first configuration 220Z. Stiffener 218 can be laminated on both sides 218A and 218B with two support layers and two foils. While traces 220A–220P are printed and etched on the foil on side 218B, the foil on the opposite side 218A is etched away. Such a symetrical buildup on both sides of stiffener 218 reduces warpage during lamination. Traces 220A–220P (not all P traces are labeled) are located such that each trace connects, after substrate 217 is formed, two micro filled vias; where one micro filled via contacts a ball attach pad and another micro filled via contacts a chip bonding pad. In this embodiment, region 231 can be used as a ground plane or a power plane by coupling to a source of ground or power reference voltage.

Configuration 220Z and various configurations 221Z, 222Z and 223Z (FIGS. 2C–2F) described herein are determined ahead of time, prior to the process being described by using a design automation software program described below in reference to FIGS. 3A–3B. In one embodiment, during the print and etch steps, the opposite side 218A (FIG. 2B) of stiffener 218 is protected, for example, by covering stiffener 218 with a layer of photoresist material.

Figure 2B:
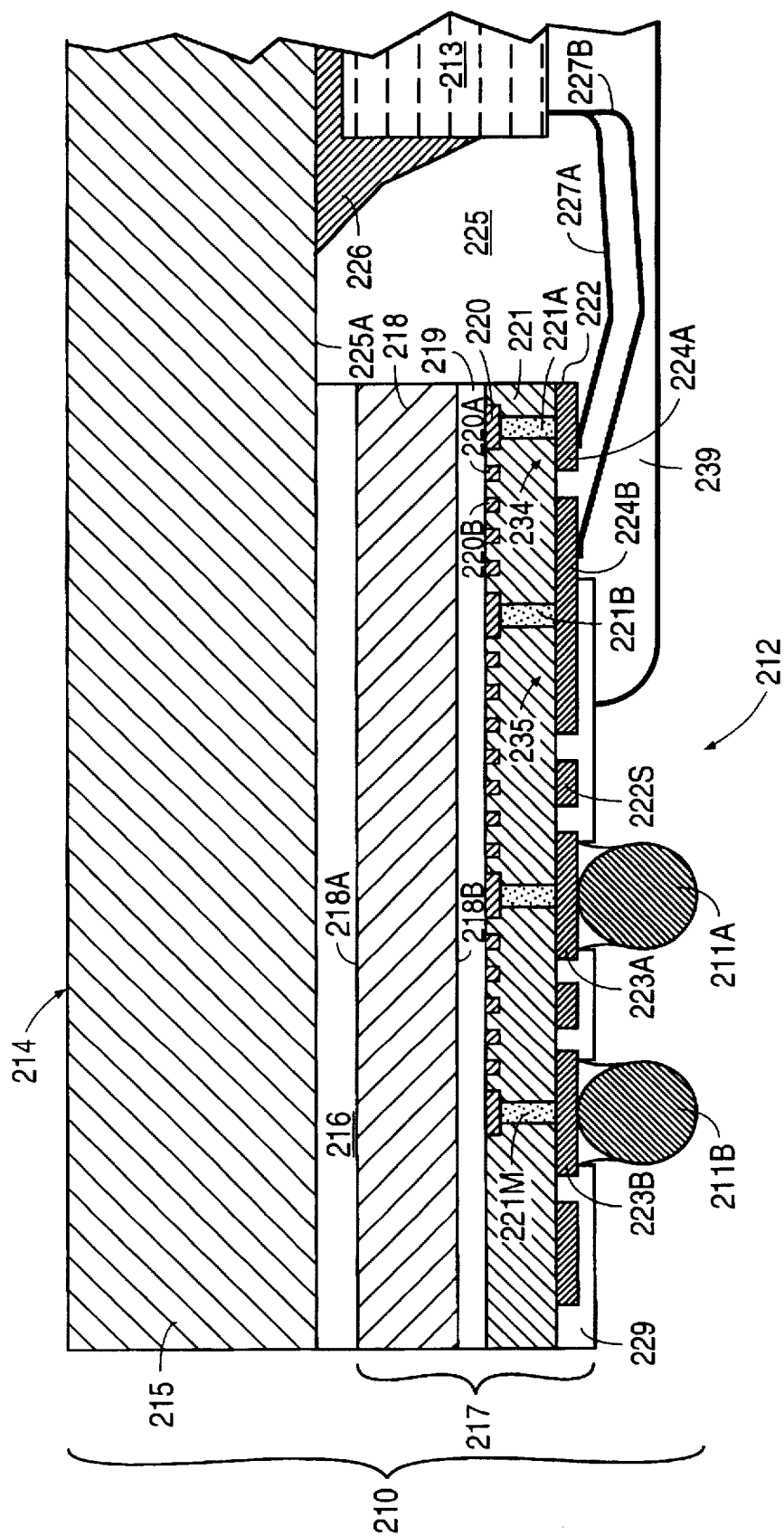
FIG. 2B illustrates, in an enlarged cross-sectional view, the cut-away portion of the ball grid array package of FIG. 2A, micro filled vias connected to pads and to inner layer traces.
Figure 2C:
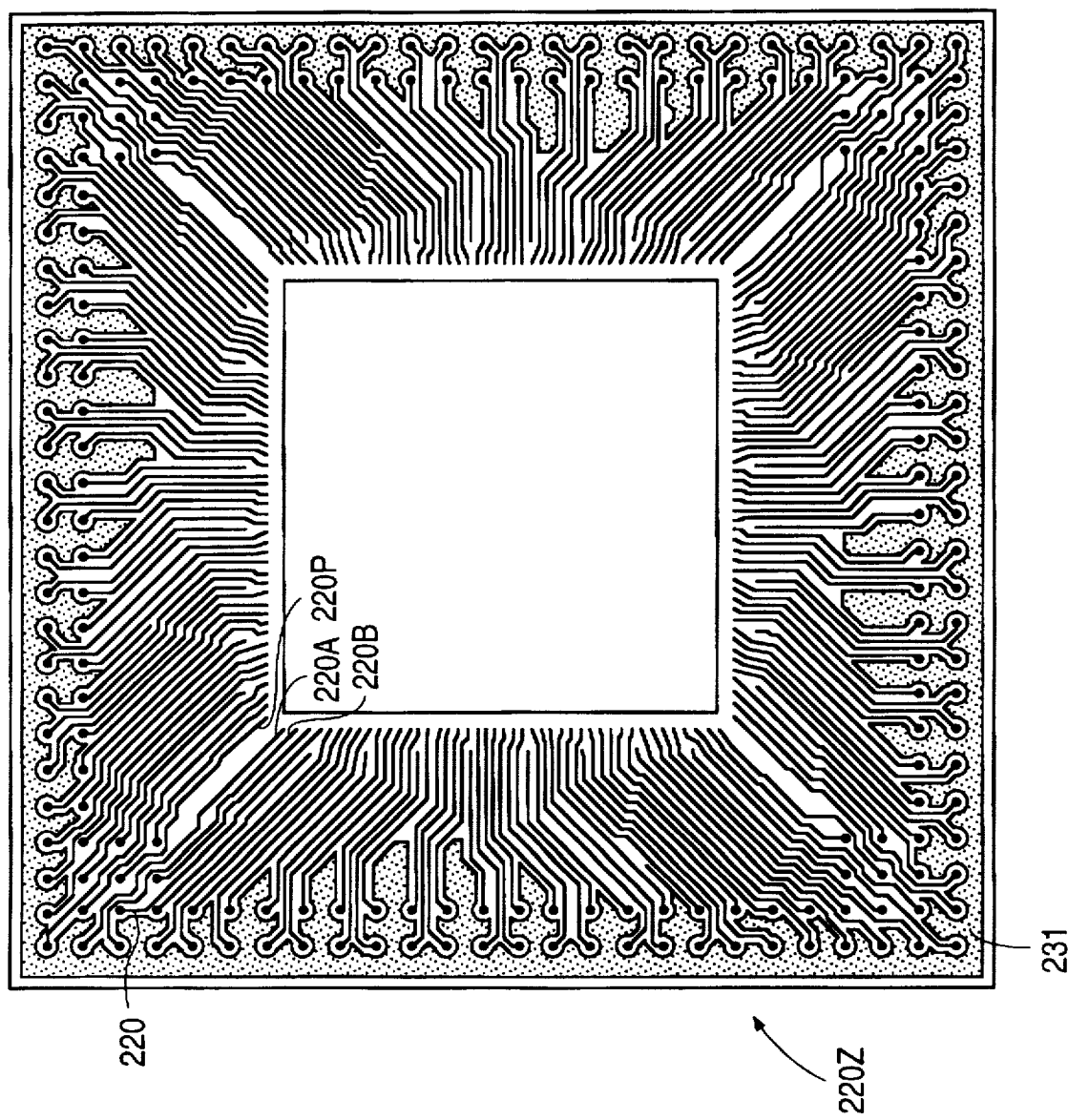
FIGS. 2C, 2D and 2E illustrate, in plan views, various predetermined configurations for an inner conductive layer, a dielectric layer and an outer conductive layer respectively of the substrate of the ball grid array package of FIG. 2A.
Figure 2D:
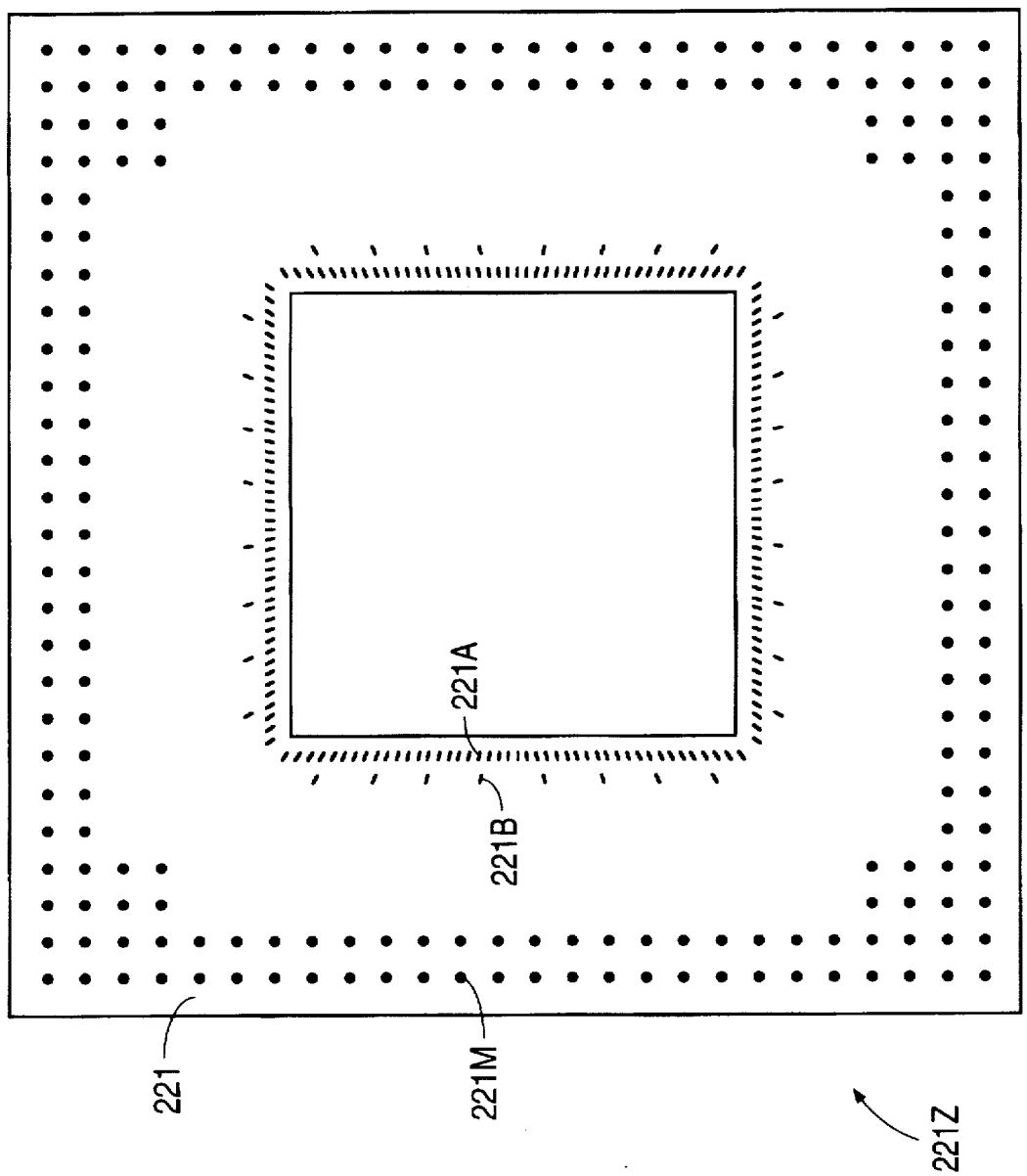

Then, a dielectric layer 221 is formed, with a number of via holes 221A–221M (not all M via holes shown in FIG. 2D are labeled) in a predetermined second configuration 221Z. Dielectric layer 221 is formed such that a micro filled via in one of holes 221A–221M connects to one of the to-be-formed ball attach pads 223A–223N (FIG. 2E) or chip bonding pads 224A–224Q (FIG. 2F), as described below.

In one embodiment, each of holes 221A–221M is substantially concentric (i.e. the center is aligned) with the center of a pad to be formed over the respective hole, such that each pad at least covers the respective hole. Moreover, in this embodiment, dielectric layer 221 is devoid of woven glass fiber typically present in conventional BGA package substrates. Elimination of woven glass fiber by use of, for example, a photoimageable dielectric material as described herein increases a BGA package's moisture resistance and reliability, because a path of moisture penetration along the surface of a glass fiber is absent.

Dielectric layer 221 can be formed of a dielectric material, by a photoimageable process or a double screen print process as described briefly below, and in greater detail in the U.S. patent application Ser. No. 08/538,886, filed Oct. 4, 1995 referenced above.

In the photoimageable process, a 2 mil thick layer area is formed of a photoimageable material (such as 80% volume PSR 4000 (see below) and 20% volume epoxy 720 (available from Ciba-Geigy)), and holes are formed in second configuration 221Z by selectively exposing the photoimageable material to light. In this particular embodiment, the holes have a 6 mil diameter and 1.5 mil depth. The photoimageable material can have various other percentage compositions of PSR-4000 and epoxy 720. Also, the photoimageable material can have 80% volume PSR-4000 and 20% volume epoxy 721 (also from Ciba-Geigy)). Alternatively, the photoimageable material can be, for example, XP 9500 (from Shipley).

A micro filled via material, described briefly below, and in detail in the above referenced application, is then stencil printed into the center of the holes of dielectric layer 221, to form micro filled vias 221A–221M.

In the double screen print process, the dielectric material and the micro filled via material are stencil printed to respectively form dielectric layer 221 and micro filled vias 221A–221M.

In one embodiment, the micro filled via (MFV) material includes a binding material and optionally includes a number of particles in any percentage loading, for example, between 0% to 60% of total volume. In one embodiment, the MFV material is a conductive paste, wherein the binding material is densely populated, with conductive particles forming more than 30% of the total volume, so that a majority of the particles touch each other. In another embodiment, the MFV material is a dielectric composite, wherein the binding material is nonconductive and is sparsely populated, with conductive particles forming less than 30% of the total volume, so that a majority of the particles are isolated and insulated from each other.

The MFV material can be an isotropic conductive paste, such as, (1) paste PC5905 or PC5328 available from Heraeus Corporation, West Conshohocken, Pa. and (2) paste 101G available from Alpha Metals Corporation, Jersey City, N.J. Commercially available conductive pastes from Epoxy Technology Corporation, Billerica, Mass., and from Alpha Metals Corporation, Jersey City, N.J. can also be used as MFV materials.

The MFV material can include a solvent, for example, diethylene glycol, to ensure uniform mixing and a low rate of evaporation needed for stencil printing. A MFV material can include a surface active coupling agent, such as a titanate equal to about 0.5% by weight of the conductive particles, to improve the metal to polymer adhesion of the MFV to be formed. Moreover, an MFV material can also include a degassing agent, for example, Byk-A 530, available from BYK Chemie U.S.A., Wallingford, Conn.

The conductive particles of a MFV material can be formed in any shape or size, depending on the characteristics needed in the to-be-formed MFV. Also, a particle in a MFV can be shaped as a spear, a rod, a spike, a flake or some other irregular shape.

To ensure a low initial resistance, the MFV material can be loaded with a very high number of conductive particles, beyond the critical volume, as described in, for example, "Critical Volume Fractions in Conductive Composites" by G. R. Ruschan and R. G. Newnham, Journal of Composite Materials, Vol. 26, No. 18, 1992 that is incorporated herein in its entirety.

In this embodiment, a substantially annular space S (FIGS. 2G and 2H) is left in a hole H in dielectric layer 221 surrounding a micro filled via material m in, for example, one of the MFVs 221A–221M. Annular space S is partially or completely eliminated during lamination of a conductive foil (described below), depending on the difference $\Delta T$ in thickness between MFV material m and the surrounding dielectric layer 221. Specifically, space S of annular width Ws is completely filled on lamination of a copper foil, if space S's volume $\pi(T3-\Delta T)[(W3/2)^2-(D1/2)^2]$ is equal to or less than $\pi\Delta T(D1/2)^2$. Such filling or overfilling is preferred in one embodiment of this invention.

Then, a conductive foil, such as a 0.5 ounce thick copper foil of the appropriate area, is laminated to dielectric layer 221 and to micro filled vias 221A–221M, and etched by any method, to form, for example, ball attach pads 223A–223N (FIG. 2E), chip bonding pads 224A–224Q (FIG. 2F), traces 228A–228U (FIG. 2E) and region 232.

The formation of layer 222 by covering a micro filled via with a pad (e.g. MFV 221A with pad 224A in FIG. 2B) or with a trace (e.g. MFV 221B with a trace connected to pad 224B in FIG. 2B) results in a pad or trace on via structure (e.g. structures 234, 235). Herein the term pad-on-via is used to represent both a trace on via or a pad on via as approriate.

In the pad-on-via structures 234, 235, MFV material is initially placed substantially in the center of the respective holes (not labeled in FIG. 2B) and on lamination (i.e. when pressed down) the MFV material occupies the annular space S (FIGS. 2G and 2H) so that the holes and MFVs 221A, 221B do not substantially affect the planarity of pad 224A and the trace connected to pad 224B.

In this embodiment, a pad, (e.g. pad 224A in FIG. 2B) is formed substantially flat (e.g. less than 10° variation in planarity of pad 224A from dielectric layer 221's surface in contact with pad 224A) and contiguous (i.e. continuous, unbroken and devoid of any holes) to cover a MFV (e.g. MFV 221A) and so allows bond wire 227A to be attached to pad 224A, or to form another dielectric layer and micro filled via for a stacked MFV as described below. In this embodiment, a MFV 221M is also placed under pad 223B. The flat and contiguous surface allows solder ball 211B to be attached to pad 223B. Such wire bonding and solder ball placement are not possible if a conventional plated via is used.

Figure 2E:
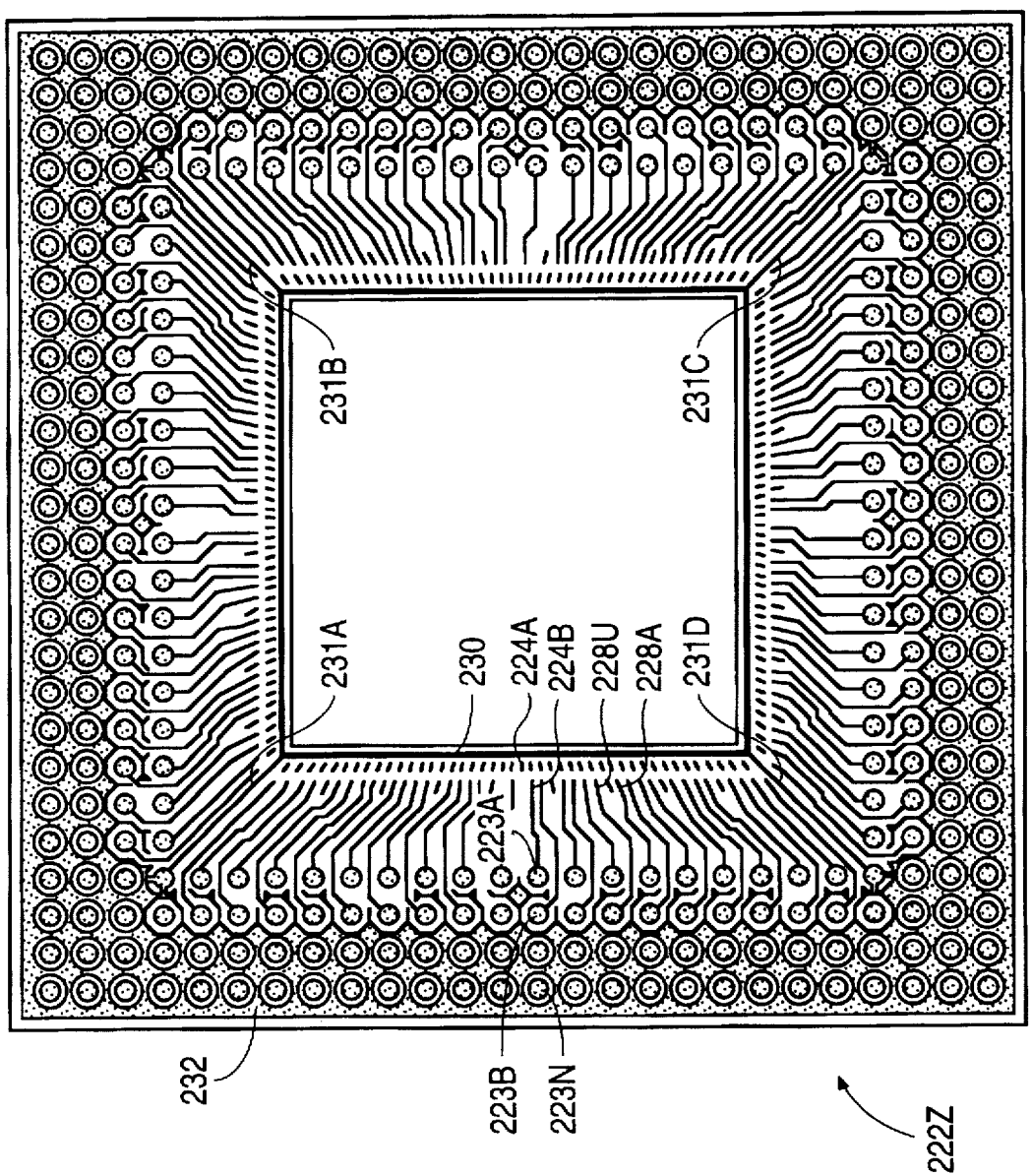

In FIG. 2E, configuration 222Z includes a ring 230 that is coupled by traces 231A–231D to a region 232. Region 232 can be used as a ground or power plane. In one embodiment, region 232 is coupled to a source GND of the ground reference voltage potential, and so shields signals on inner layer traces 220A–220P (FIG. 2C) from noise, and allows the impedance of traces 220A–220P to be uniformly maintained within a predetermined range.

In one particular embodiment, the laminated copper foil described above is etched as follows to form layer 222 (FIG. 2B). A photoresist is applied on surface 218A of stiffener 218, and on exposed surface 222S of the laminated copper foil, with areas of the to-be-formed traces and pads left open, as illustrated in FIG. 2E. Then, the open areas are covered by a layer of electrolytically plated nickel, for example of thickness 150 microinches, followed by a layer of electrolytically plated wire bondable gold, for example of thickness between 30 and 50 microinches. The photoresist is then stripped off from surfaces 222S and 218S, and another layer of photoresist is optionally formed only on surface 218A. Next, using the gold and nickel layers as the etch mask, the copper foil is etched to form traces 228A–228U, region 232 and pads 223A–223N and 224A–224Q in outer conductive layer 222.

A protective layer 229, e.g. a layer of solder mask, such as 1 mil thick PSR-4000 available from Taiyo America, Inc., 1179 Fairview Dr., Suite E, Carson City, Nev. 89701 can be then applied on both sides. The area of ball attach pads 223A–223N (where N is the number of ball attach pads) and the annular square region 237 surrounding chip bonding pads 224A–224Q (where Q is the number of chip bonding pads) are left open in a predetermined fourth configuration 223Z (FIG. 2F) to allow attachment of solder balls and bond wires (as described below). Next, using a conventional routing step, a cavity 225 (FIG. 2B) is formed in substrate 217, for example of area $(466\pm5)^2$ mil$^2$, with a corner radius less than 3 mil. An adhesive film 216, for example, a 1 mil thick Pyralux or no flow prepreg, with the cavity area e.g. $(460\pm5)^2$ mil$^2$ cut off, is also routed in a similar manner.

Then, a heat sink 215 (FIG. 2B) of the appropriate area, for example, a copper sheet of 10 mil thickness and plated with 300 microinches of nickel on side 214 and also covering the center cavity area 225A is laminated using adhesive film 216 to surface 218A of substrate 217.

Integrated circuit chip 213 can then be mounted inside cavity 225 on heat sink 215 by a die attach material 226, and bond wires, for example, of gold, bonded by wire bonding machines (not shown) to connect pads (e.g. pads 486A to 486E in FIG. 4C) on an IC chip to chip bonding pads (e.g. pads 481A–484X described below). Finally, IC chip 213 is sealed for example by a conventional glob-top process with encapsulant 239 (FIG. 2B) and solder balls 211A–211N (FIG. 2A) of, for example, 25 mils diameter are attached to corresponding ball attach pads 223A–223N (FIG. 2F), to thereby complete formation of BGA package 210.

In one embodiment, BGA package substrates are formed by routing appropriate areas of the panel being processed. In this embodiment, a BGA package substrate has the protective layer, the dielectric layer and the binding material all chosen to have a high glass transition temperature, for example >150° C., and preferably >170° C. Materials of higher glass transition temperatures are preferable, to allow substrate 217 to be heated up to a temperature of, for example, 160° C. for wire bonding, and 150° C. for reliability testing.

Figure 2F:
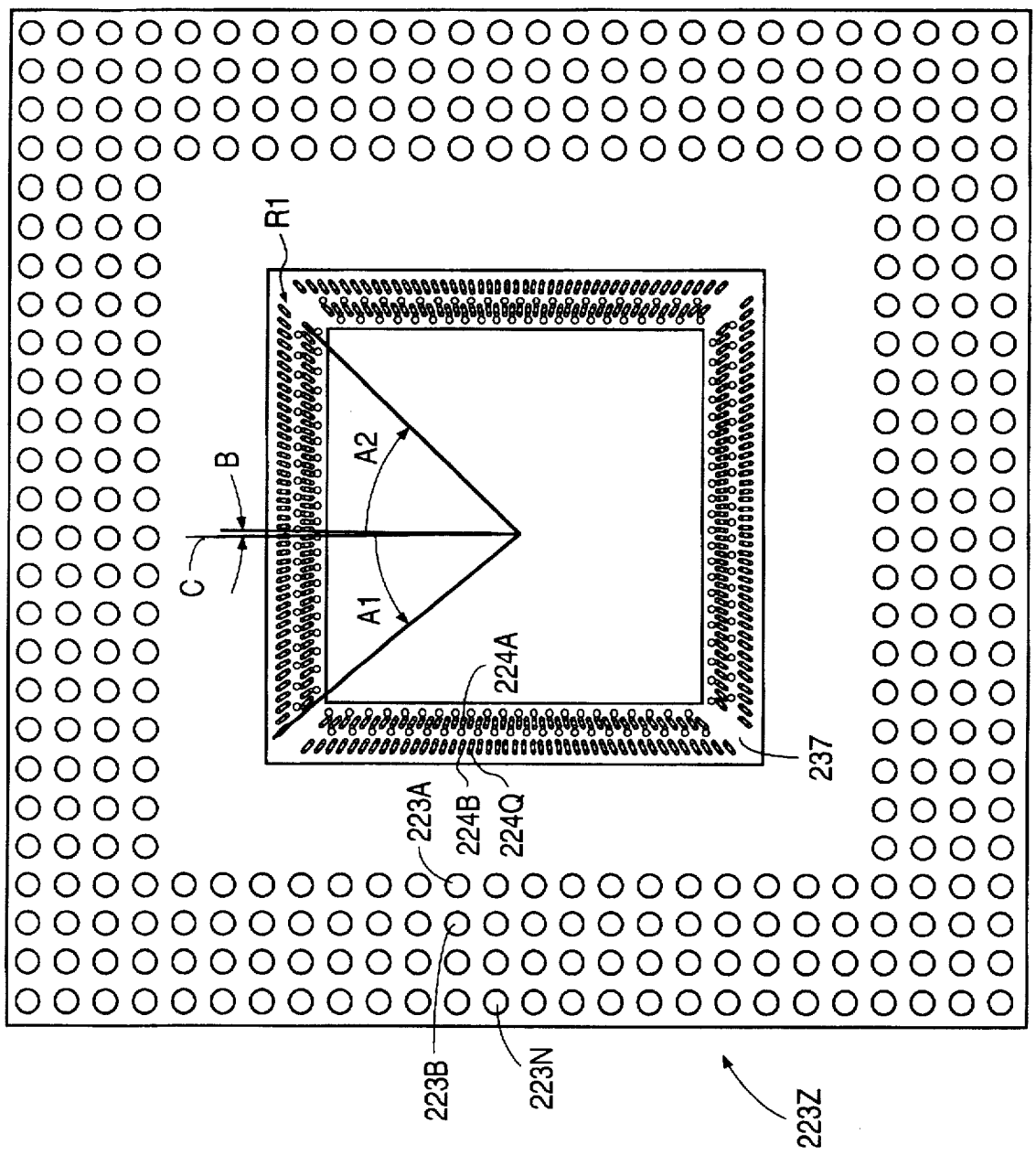
FIG. 2F illustrates a plan view of a contact side 212 (FIG. 2A) showing open areas of a protective layer 229 in substrate 217.
Figure 2G:
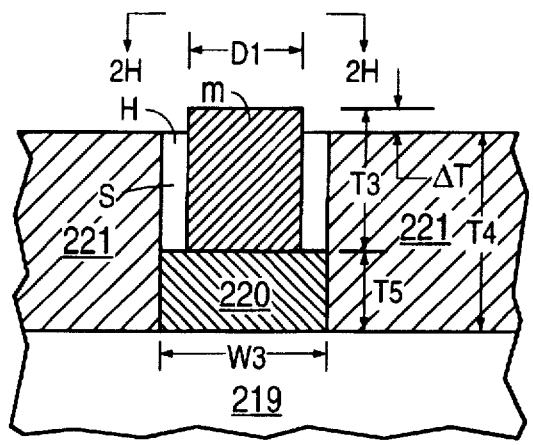
FIGS. 2G and 2H illustrate in cross-sectional and plan views respectively, the space between a hole and a micro filled via during formation of a ball grid array package.
Figure 2H:
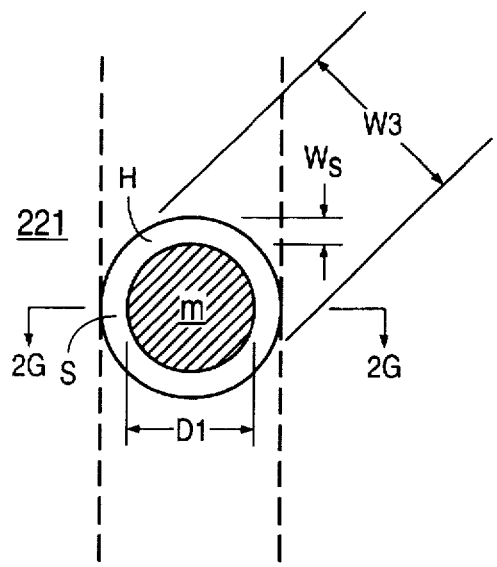

The features shown in FIGS. 2A–2F are merely illustrative of various embodiments of this invention. For example, although two rows of solder balls 201A–201N are illustrated in FIGS. 2A and 2B, and four rows of ball attach pads 223A–223N are illustrated in FIG. 2F, any number of such rows can be formed in different embodiments of this invention.

BGA package 210 is devoid of a conventional BT core (described below) and drilled vias in the core, and so is less expensive to fabricate than a conventional BGA package. Moreover, BGA package 210 can be made with a smaller footprint than a conventional BGA package, because a trace can be formed on an inner layer, with each end of the inner layer trace coupled to a pad on an outer layer through micro filled via.

Figure 3A:
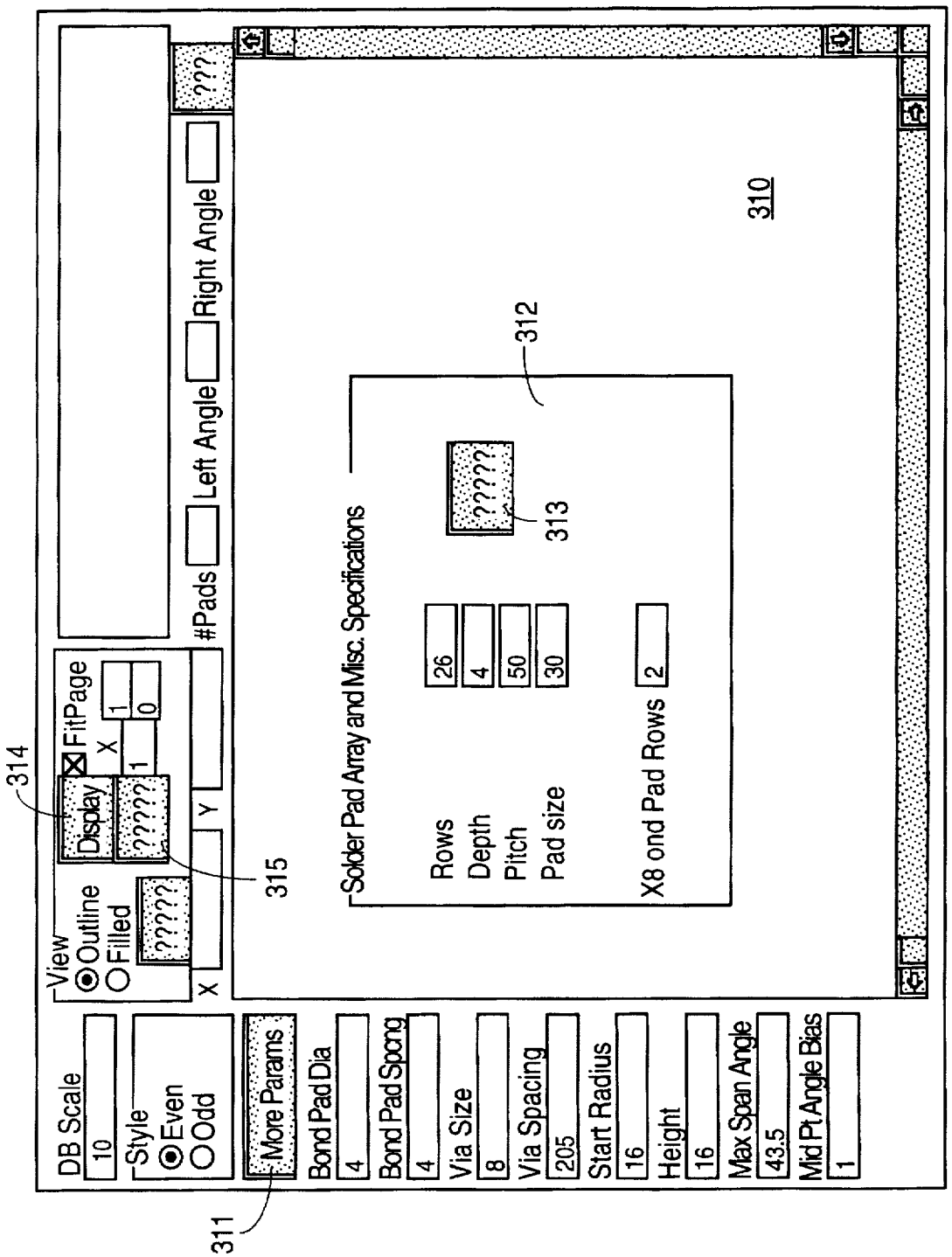
FIGS. 3A and 3B illustrate screens for entering data into and for viewing results from a programmed computer that automatically generates a configuration showing locations of bond attach pads and chip bonding pads with micro filled vias, as illustrated in FIG. 2F.
Figure 3B:
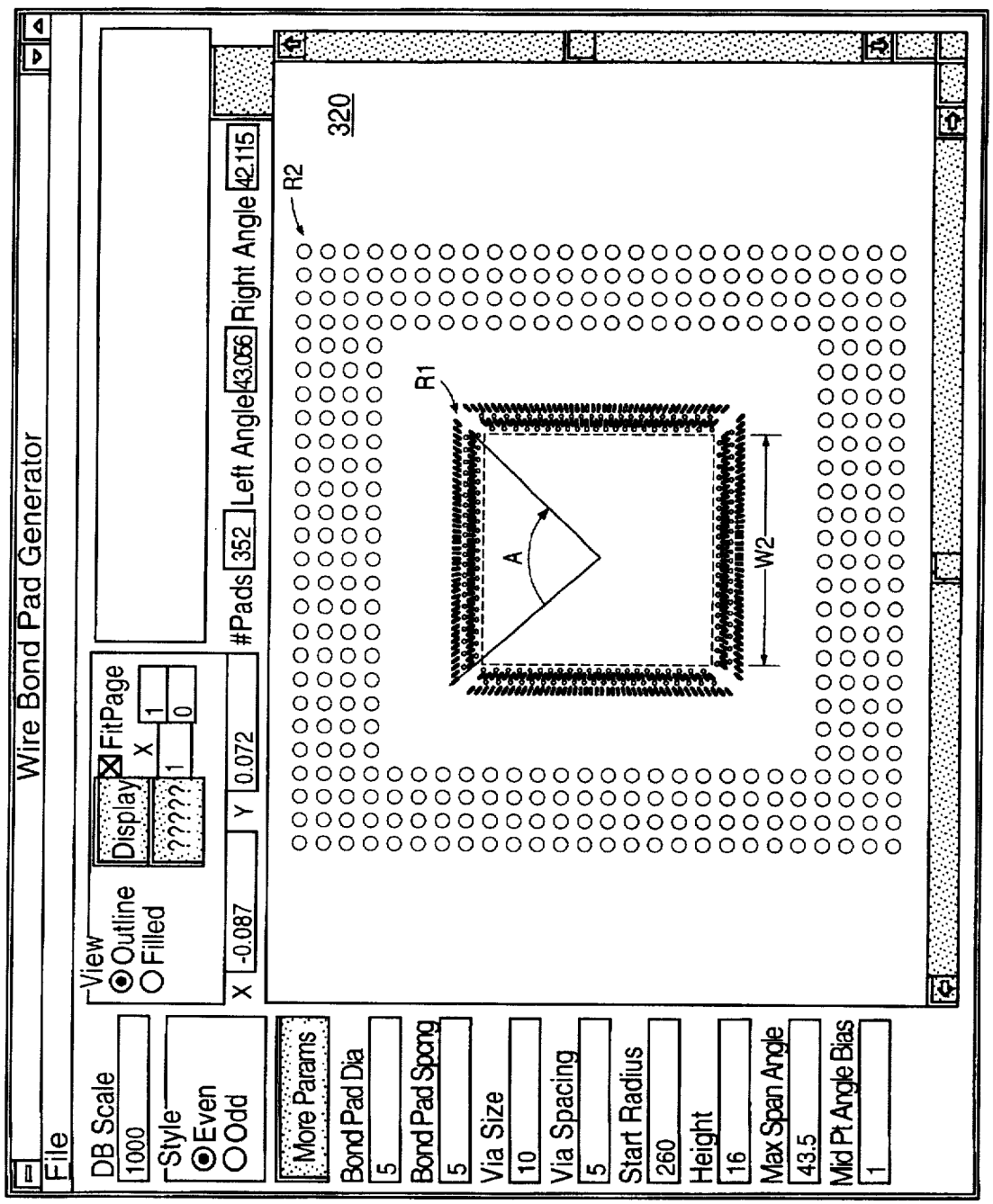

FIGS. 3A–3B illustrate screens 310 and 320 for a user to enter data and to see the results of a design automation software program (Microfiche Appendices A and B) that can be used, for example, by a customer to design an IC package of predetermined configurations illustrated in FIGS. 2–2F. The design automation software program (hereinafter "software program") simplifies design cycles by allowing a designer to perform many iterations of design quickly, before a BGA package is actually made. The design automation software program uses the pad-on-via structure if possible and so minimizes a BGA package's footprint.

To use the software program, the user enters in screen 310 (FIG. 3A) in the field "DB Scale", a multiplication factor (for example 10) for dimensions (for example, with a resolution of 0.1 mil) to be entered on the screen, corresponding to internal representations in the data structure of the software program. The user enters in the field "Bond Pad Dia", the width of each wire bond finger (i.e. chip bonding pad) in mils. The user enters in the field "Bond Pad Spcng", the minimum distance in mils that must be maintained between two adjacent wire bond fingers.

Also, the field "Via Size" is the diameter W3 of a hole for a micro filled via; the field "Via Spacing" is the minimum distance that must be maintained between two micro filled vias or between a micro filled via and a wire bond finger; the field "Start Radius" is half of the width W2 (FIG. 3B) of the cavity 225 in the BGA package 210; the field "Height" is the length of a wire bond finger in a direction perpendicular to the side of the cavity; the field "Max Span Angle" is the maximum of the angles A1 and A2 (FIG. 3B) from a center line C to either one of the two diagonal wire bond fingers of a row e.g. row R1; and the field "Mid Pt Angle Bias" is the angle B (FIG. 2F) formed by the central wire bond finger of a row, for example, row R1 with the center line C of row R1.

On clicking button 311 labelled "More Params", a window 312 labelled "Solder Pad Array and Misc. Specifications" pops up. In window 312, the field "Rows" is the number of ball attach pads in a given row, for example, row R2; the field "Depth" is the number of rings of ball attach pads, for example 4, to be formed; the field "Pitch" is the center to center distance in mils. between two adjacent ball attach pads; the field "Pad size" is the diameter in mils of a ball attach pad; and the field "#Bond Pad Rows" is the number of rows of wire bond fingers. In one embodiment, the user specifies dimensions in conformance with the industry standard BGA package as defined in Letter Ballot JC-11.11.92-163, Item 11-354 and registered in JEDEC (Joint Electron Device Engineering Counsel) publication 95.

Once the user specifies all of the above discussed fields, the user can click on button 313 labelled "OK", to save the entered parameters and then click on the button 314 labelled "Display" to display the results of the software program. The results can be printed by clicking on the button 315 labelled "print."

The software program of microfiche Appendices A and B currently prepares only the fourth configuration 223Z (FIG. 2F). A user can use fourth configuration 223Z to manually determine the other three configurations 220Z, 221Z and 222Z. The user can iteratively use the software program to create a number of alternative configurations that can be evaluated to determine the optimal configuration of a ball grid array package for a given IC chip. The software program listed in the microfiche Appendices A and B can be extended to automatically create the other three configurations 220Z, 221Z and 222Z.

The software program listed in microfiche Appendices A and B is in the language "Visual Basic", and can be used with a Microsoft Visual Basic Interpreter, version 3.0, available from the Microsoft Corporation, One Microsoft Way, Redmond Wash. The Microsoft Visual Basic Interpreter runs on Microsoft Windows 3.1 Operating System, also available from the Microsoft Corporation. All these software programs can be run on an industry standard 386 microprocessor based IBM Personal Computer or a clone. The software program can also be extended to extract electric parameters (such as resistance, capacitance, inductance) for each BGA package design.

Figure 4A:
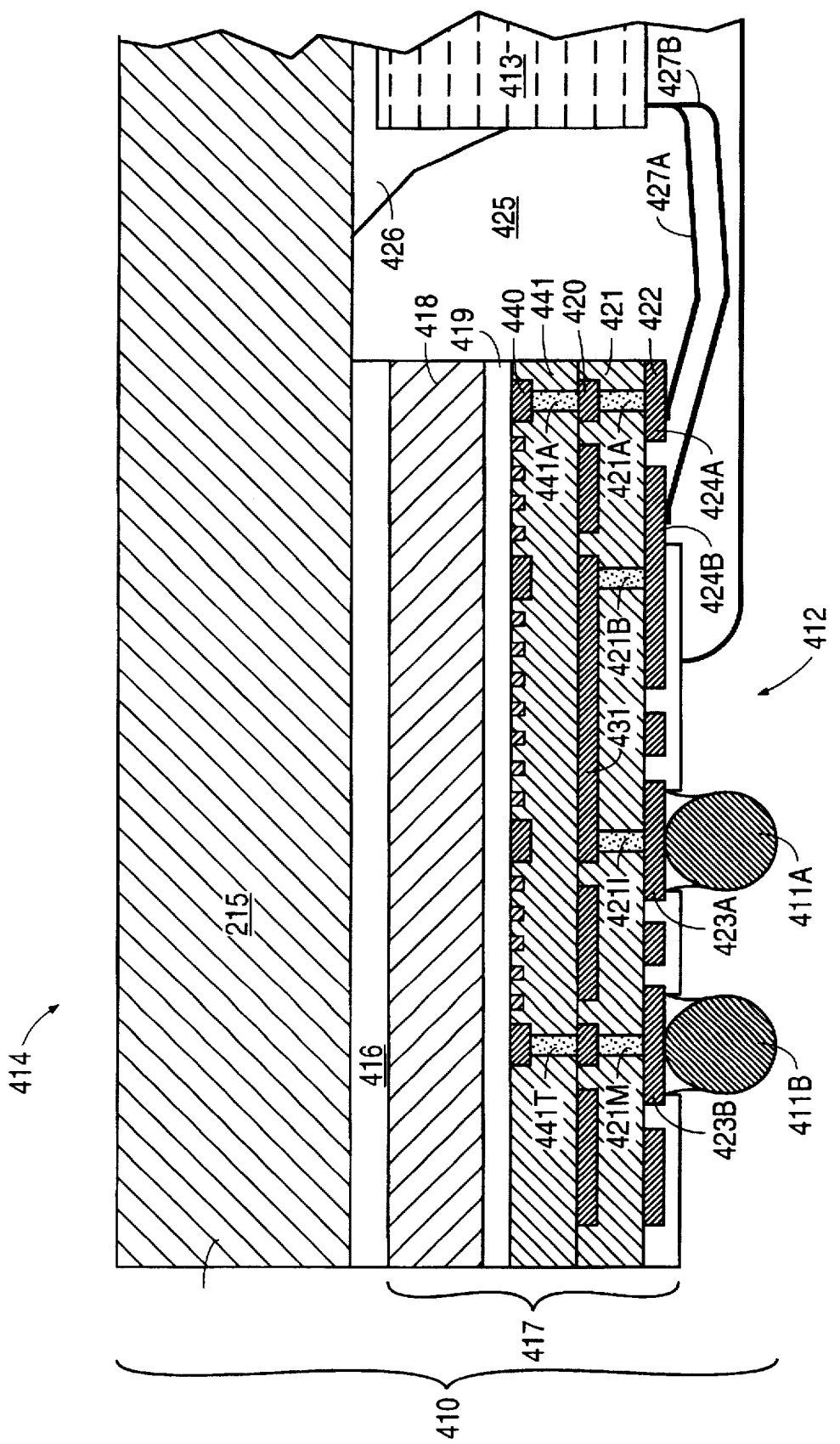
FIG. 4A illustrates, in a partial cross-sectional view, one embodiment of a ball grid array package having an outer conductive layer and two inner conductive layers, with micro filled vias in two dielectric layers separating the three conductive layers.

Although BGA package substrate 217 has only one inner conductive layer, in other embodiments the BGA packages have multiple conductive layers, for example, for ground or power planes or for signal traces, and additional dielectric layers with MFVs as follows. FIG. 4A illustrates one such BGA package 410 with multiple inner conductive layers. Many of the reference numerals in FIG. 4A are derived by adding 200 to reference numerals that represent similar features in FIGS. 2A–2E.

In addition to dielectric layer 421, micro filled vias 421A–421M and inner conductive layer 420, BGA package 410 also has a second dielectric layer 441, micro filled vias 441A–441T (where T is the number of micro filled vias in dielectric layer 441) and a second inner conductive layer 440, all of which can be formed by repeating various steps described above in reference to FIGS. 2A–2F. In this embodiment, Ni/Au coating (as described above) is used only to form the outer conductive layer 422 (FIG. 4A).

The second inner conductive layer 440 provides flexibility in interconnecting chip bonding pads 424A–424N and ball attach pads 423A–423N as compared to the prior art. For example, in BGA package 410, chip bonding pad 424A is connected by two micro filled vias 421A and 441A to a trace in the second inner conductive layer 440, which trace is connected by micro filled vias 441T and 421M to ball attach pad 423B. In this embodiment, micro filled vias 421A, 441A are aligned with each other and collectively referred to as a "stacked micro filled via".

Not all chip bonding pads of BGA package substrate 417 are coupled to a stacked micro filled via. For example, chip bonding pad 424B is connected by micro filled via 421B to a trace 431 in inner conductive layer 420 and trace 431 is connected by another micro filled via 421I to ball attach pad 423A.

Although only two dielectric layers 421 and 441 are illustrated in the BGA package 410, any number of such dielectric layers can be formed in different embodiments of this invention, with or without stacked MFVs. Moreover, although in this embodiment two micro filled vias form a stacked MFV, any number of MFVs can be aligned with each other to form stacked MFVs in other embodiments.

Figure 4B:
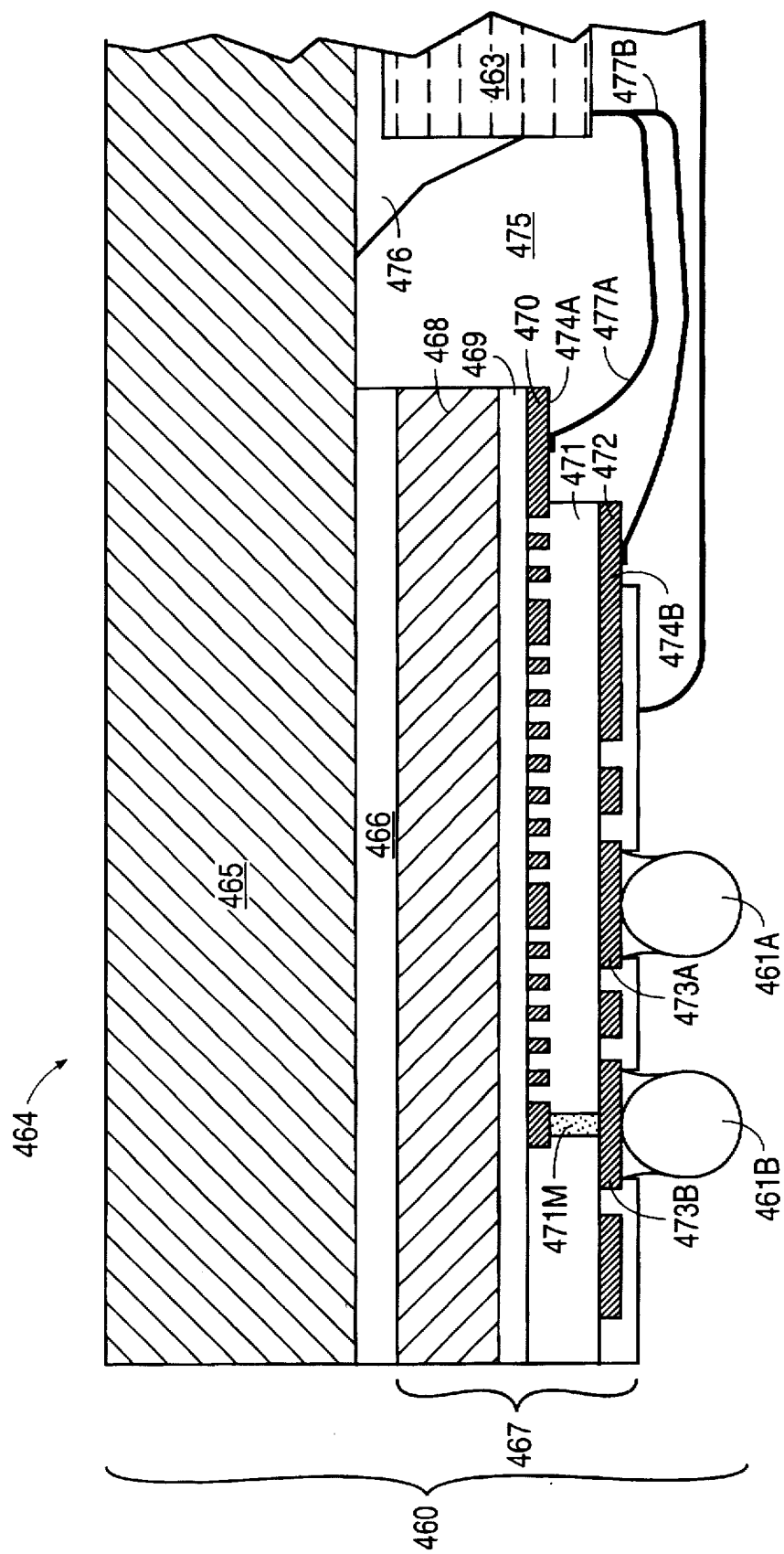
FIG. 4B illustrates, in a partial cross sectional view, one embodiment of a ball grid array package having a stepped substrate with two tiers of chip bonding pads.

In another embodiment of this invention, BGA package 460 (FIG. 4B) has a stepped substrate 467. Many of the reference numerals in FIG. 4B are derived by adding 250 to reference numerals that illustrate similar features in FIGS. 2A–2F.

In stepped substrate 467 (FIG. 4B), a portion of dielectric layer 471 is removed around the periphery of cavity 475 to expose a portion of inner conductive layer 470 to form a number of chip bonding pads, such as pad 474A. Therefore, in stepped substrate 467, bond wire 477A is directly connected to inner layer 470, thereby eliminating the need for a micro filled via to connect a chip bonding pad to an inner layer, e.g. to eliminate micro filled via 221A in FIG. 2B. Therefore, in stepped substrate 467, chip bonding pad 474A is connected through only one micro filled via 471M to bond attach pad 473B.

In stepped substrate 467, micro filled vias need only be formed under certain ball attach pads, such as pad 461B. Hence, the pitch (distance between two MFVs) is much larger, and the process yield is much higher than a single tier substrate (e.g. substrate 217 of FIGS. 2A–2F). So, in this embodiment, the MFVs' pitch is the same as the pitch of outer row ball attach pads.

A BGA package can have four rows of pads: a ground row and a power row formed of pads predetermined for coupling to a source of ground reference voltage potential or power reference voltage potential respectively, and two signal rows formed of pads predetermined for carrying various signals. Such a BGA package requires four different bond wire loops, and is less preferable than a BGA package having only three rows with three loops. Every additional loop requires wire to have a higher clearance from the IC chip surface thus increasing the inductance of the wire and yield loss.

Figure 4C:
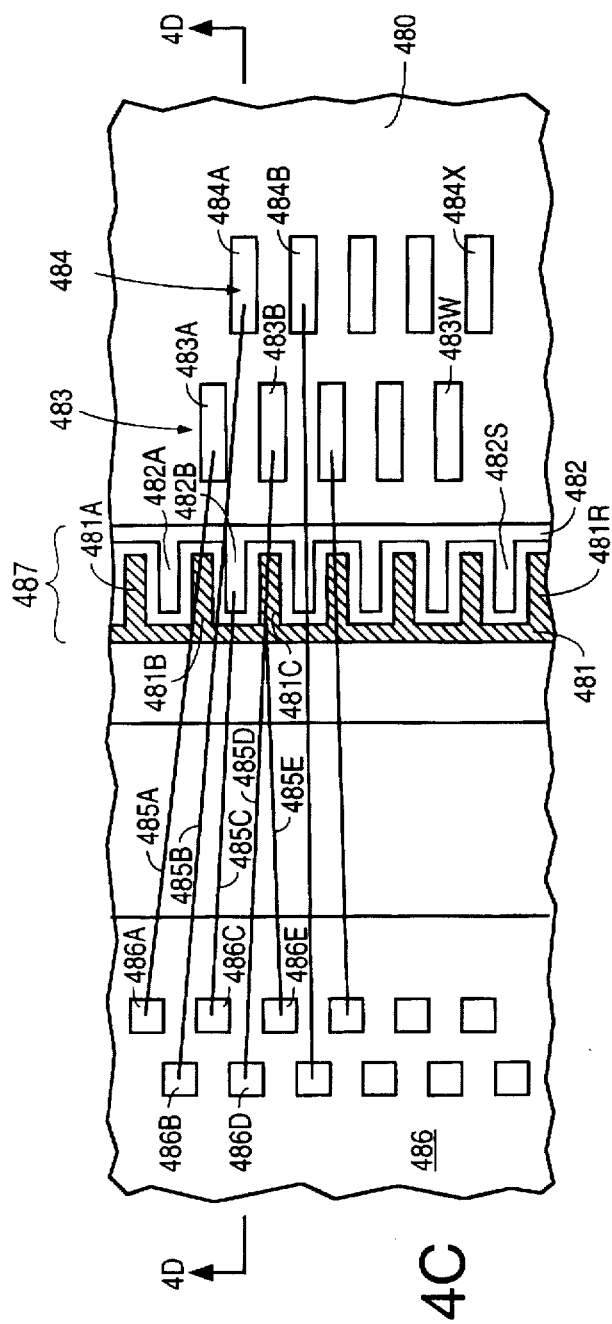
FIGS. 4C and 4D illustrate, in plan and cross-sectional views respectively, an interdigitated configuration of ground-row and power-row chip bonding pads.
Figure 4D:
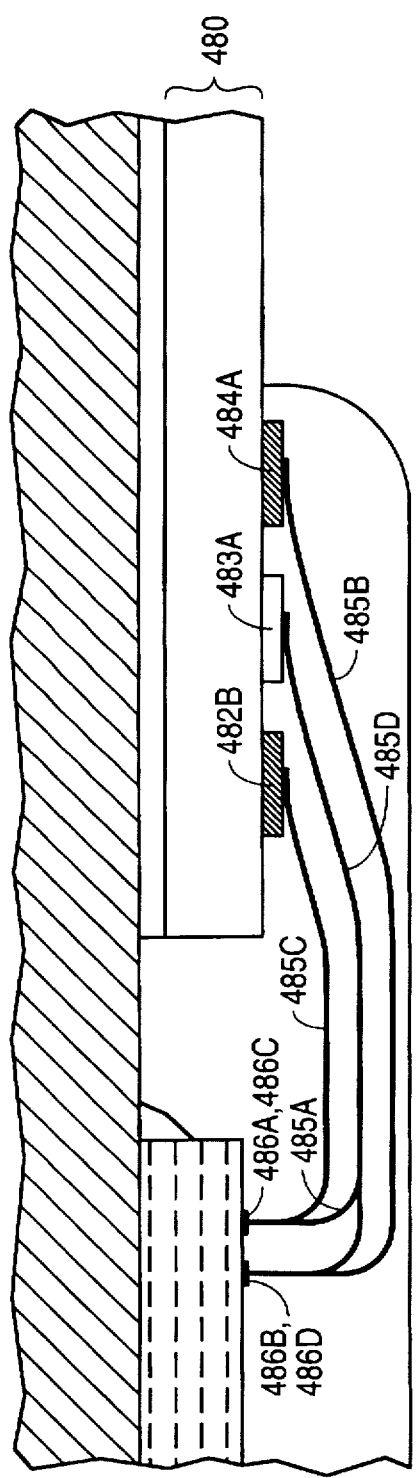

In one embodiment, a EGA package has only three rows: a ground-power row formed of pads that are predetermined for coupling alternatively to a source of ground or power reference voltage respectively, and two signal rows. Specifically, substrate 480 has chip bonding pads formed in three rows: an inner row 487, a middle row 483 and an outer row 484 (only a portion of each row is illustrated in FIG. 4C, although these rows are similar to the rows illustrated in FIG. 2F).

Inner row 487 is a ground-power row and includes a total of "R" chip bonding pads 481A–481R that are connected to each other by ground ring 481. Ground ring 481 is a square shaped continuous ring in this embodiment, and is predetermined for coupling to a source of the ground reference voltage potential. Inner row 487 also includes a total of "S" chip bonding pads 482A–482S, each of which is physically located between two adjacent pads of chip bonding pads 481A–481R. Each of chip bonding pads 482A–482S is connected to a power ring 482 that is also a square shaped continuous ring in this embodiment and is predetermined for coupling to a source of the power reference voltage potential.

Middle row 483 and outer row 484 include chip bonding pads 483A–483W and 484A–484X respectively, all of which are isolated from each other in this embodiment. A pad of integrated circuit chip 486 can be coupled to a pad of any row 483, 484 and 487. For example, in the specific embodiment illustrated in FIG. 4C, pads 486A–486E are connected by respective bonding wires 485A–485E to chip bonding pads 483A, 484A, 482B, 483B and 481C respectively.

Therefore in this embodiment, chip bonding pads 481A–481R that are connected to ground ring 481 and chip bonding pads 482A–482S that are connected to power ring 482 interdigitate with each other to form a single row, thereby eliminating the two separate rows for ground and power present in a conventional BGA package.

Figure 5A:
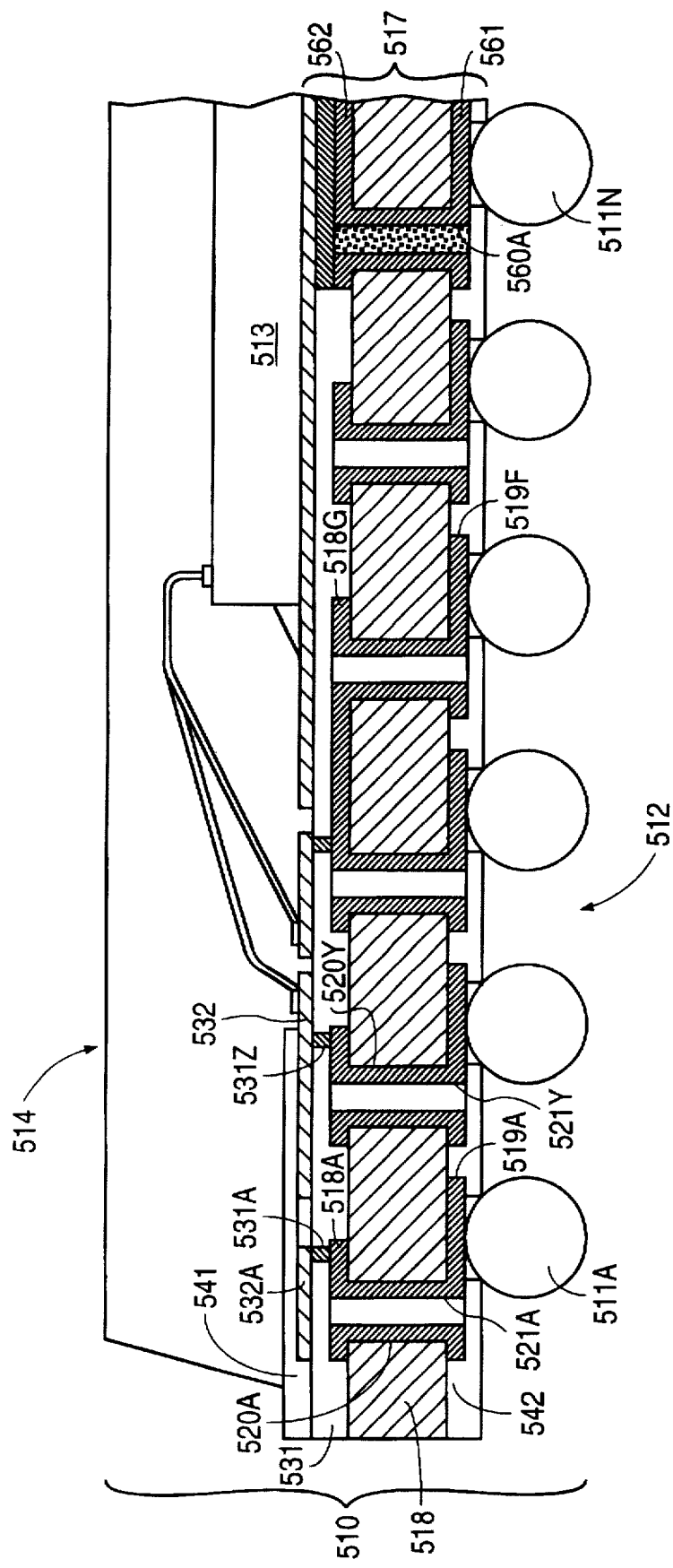
FIG. 5A illustrates, in a partial cross-sectional view, one embodiment of a cavity up ball grid array package.
Figure 5B:
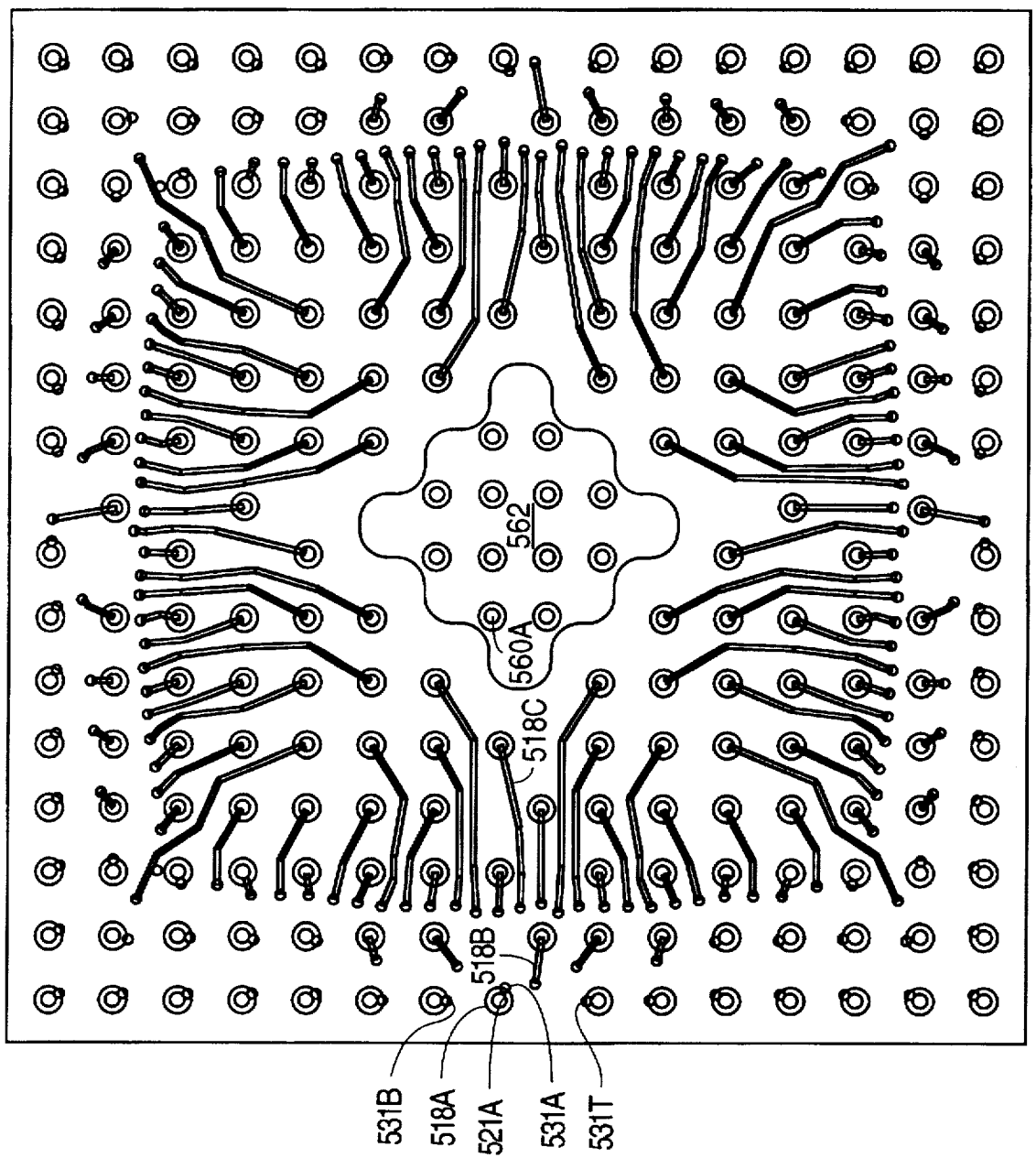
FIGS. 5B–5F illustrate, in plan views, various predetermined configurations of the layers of the ball grid array package substrate of FIG. 5A.

In one embodiment, BGA package 510 (FIG. 5A) has a cavity up configuration, with solder balls 511A–511N located on PCB contact side 512 and integrated circuit chip 513 located on an opposite side (also called "exposed side") 514. BGA package 510 includes a substrate 517 formed of a foil cladded core layer 518, e.g., copper clad bismaleimide-triazine ("BT") core available from Mitsubishi Gas Chemical Corp. Japan. Vias 521A–521Y, thermal regions 561, 562 and traces 518A–518G and 519A–519F are formed in BT core 518 by conventional pattern plating and etching, as illustrated by the configurations in FIGS. 5B (seen from exposed side 514) and 5C (seen from contact side 512). Then vias 521A–521Y are filled with nonphotoimageable material to form a flat surface at each of the two ends of each of vias 521A–521Y. The nonphotoimagable material can be either conductive (such as conductive paste) or nonconductive (such as epoxy).

Then a dielectric layer 531 (FIG. 5A) with micro filled vias 531A–531T (not all T MFVs in dielectric layer 531 are labeled in FIG. 5B) is formed, for example, by the photo-imaging process or the double screen printing process described above. Dielectric layer 531 can have a thickness of, e.g. 2 mils.

Figure 5C:
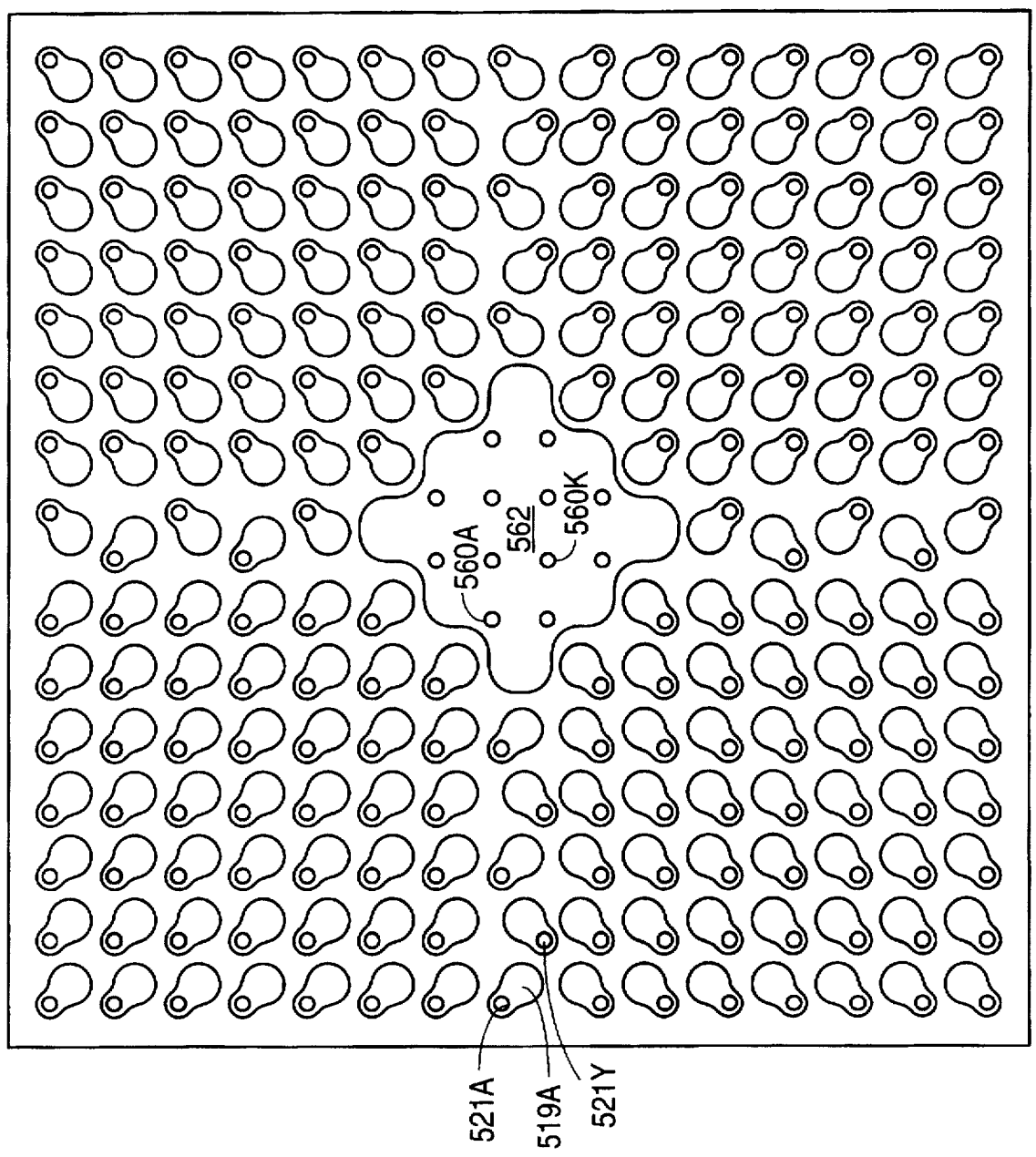
Figure 5D:
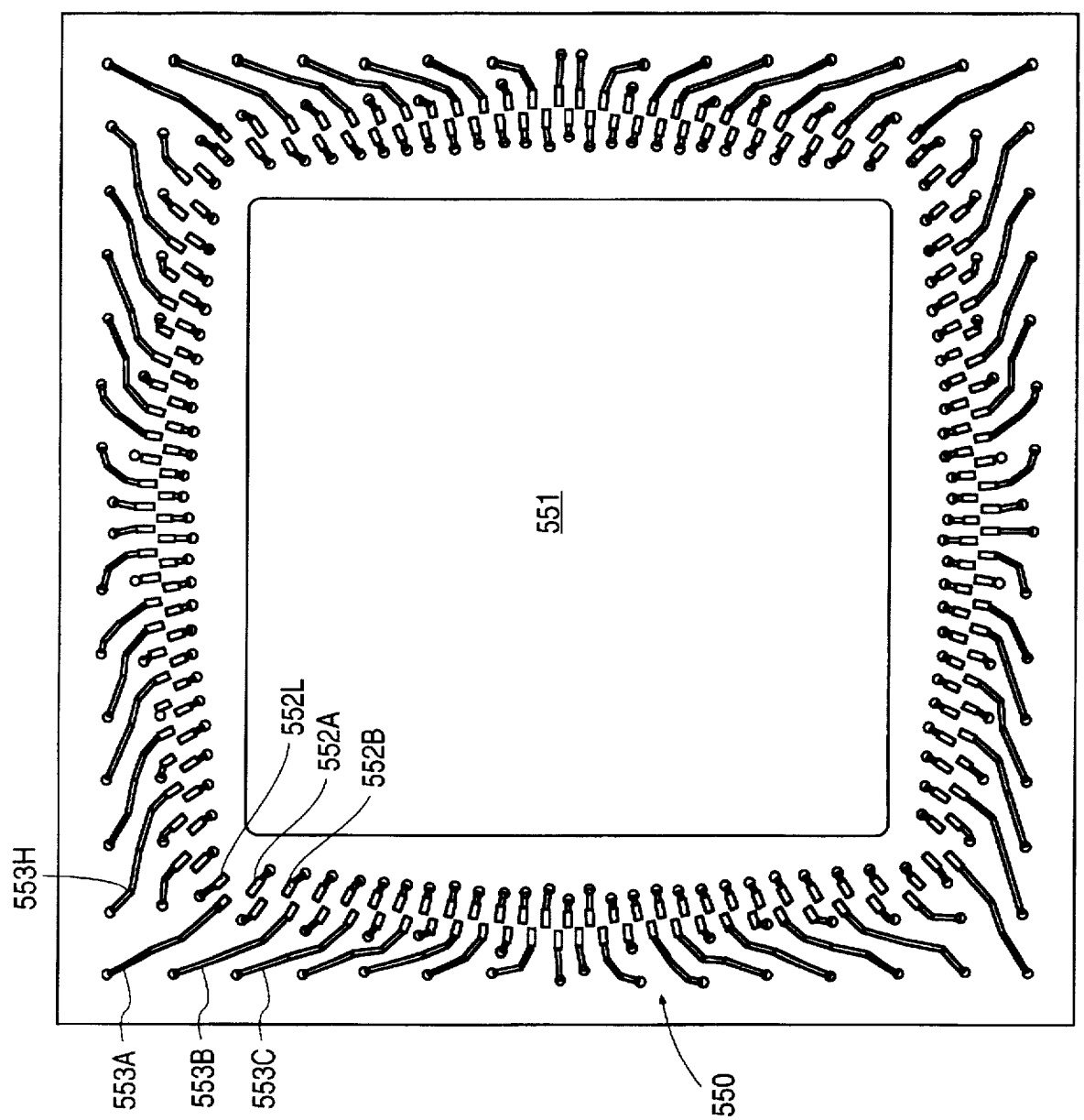
Figure 5E:
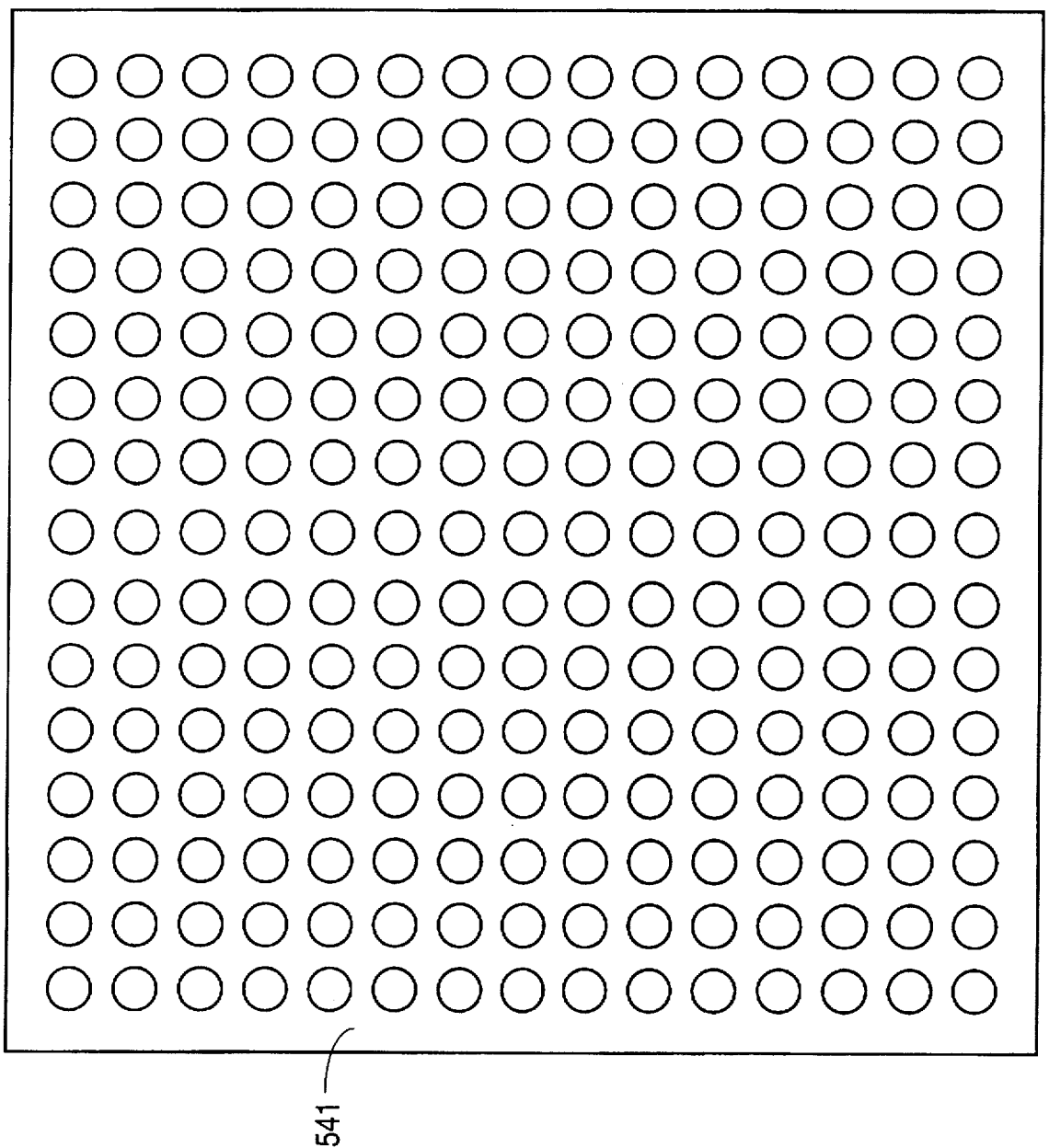
Figure 5F:
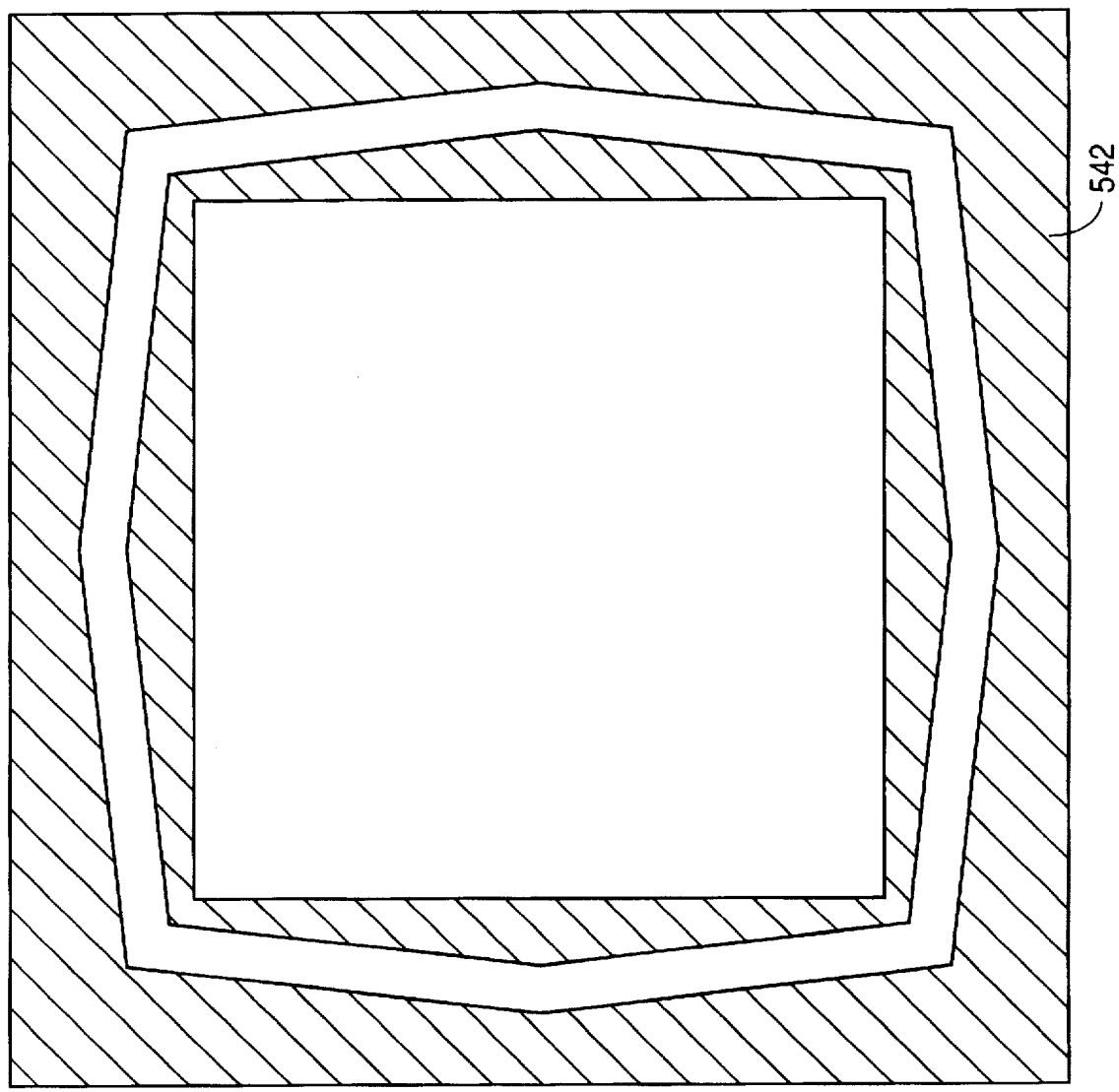

Next, a conductive foil 532 (e.g. a 0.5 ounce thick copper foil), is vacuum laminated on dielectric layer 531, and with side 512 protected, and a predetermined pattern 550 (FIG. 5D) is etched in foil 532, to form die attach pad 551, chip bonding pads 552A–552L and traces 553A–553H (not all L pads and all H traces are labeled in FIG. 5D). Then, protective layers 541 (FIG. 5E) and 542 (FIG. 5F), e.g. solder mask, are applied on exposed side 514 (FIG. 5A) and contact side 512 respectively, to complete formation of substrate 517.

BGA package 514 described above has a number of plated vias including, thermal vias 560A–560H (FIG. 5C), and signal vias 521A–521Y. Thermal vias 560A–560K are placed in an area to be covered by integrated circuit chip 513, to conduct heat away from chip 513. The thermal vias 560A–560K can be filled with a thermally conductive paste.

In another embodiment, a wire bondable nickel gold layer is applied, using conventional electrolytic or electroless process, on wire bond pad or solder ball attach pad.

Either after a BGA package substrate is formed as described above, or immediately after the traces 532A–532Y are defined, the micro filled via material can be optionally programmed, for example, to form an electrical conductor or to lower the resistance and enhance the long term reliability of an electrical conductor in the MFVs in a substrate. Specifically, a programming voltage or current can be applied between a ball attach pad and a chip bonding pad that are coupled to each other through one or more micro filled vias.

Figure 6A:
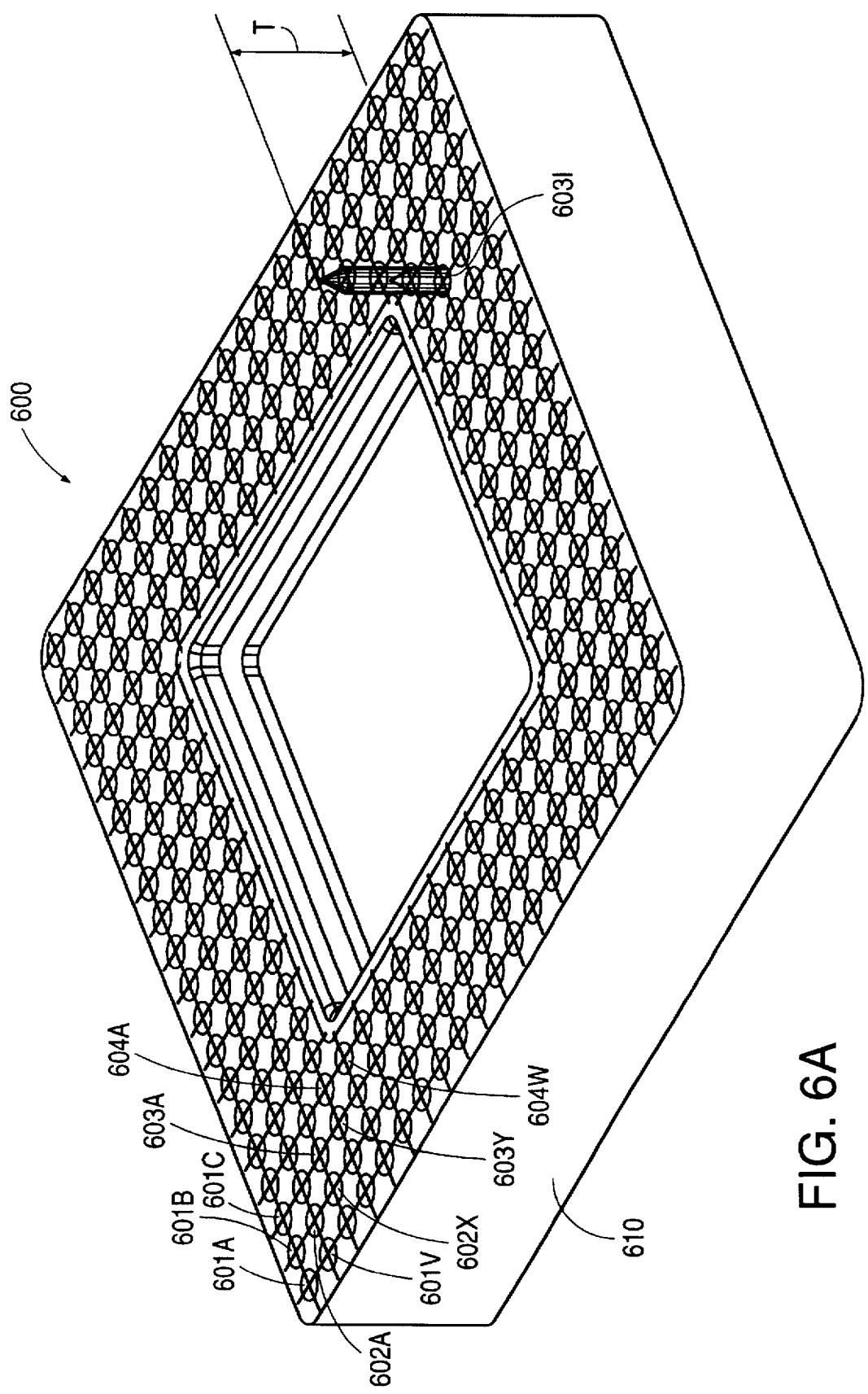
FIGS. 6A and 6B illustrate, in a perspective view and a cross-sectional view respectively, an apparatus for programming micro filled vias in a BGA package.

In one embodiment, the chip bonding pads are all shorted to the ground source and each of the ball attach pads are individually accessed by a probe as illustrated by a programming fixture 600 (FIG. 6A). Programming fixture 600 has a number of tubes 601A–601V, 602A–602X, 603A–603Y and 604A–604W, arranged in four respective rows, where V, X, Y and W are the number of tubes in the respective rows, arranged in a predetermined configuration, such as the configuration 223Z (FIG. 2F).

Figure 6B:
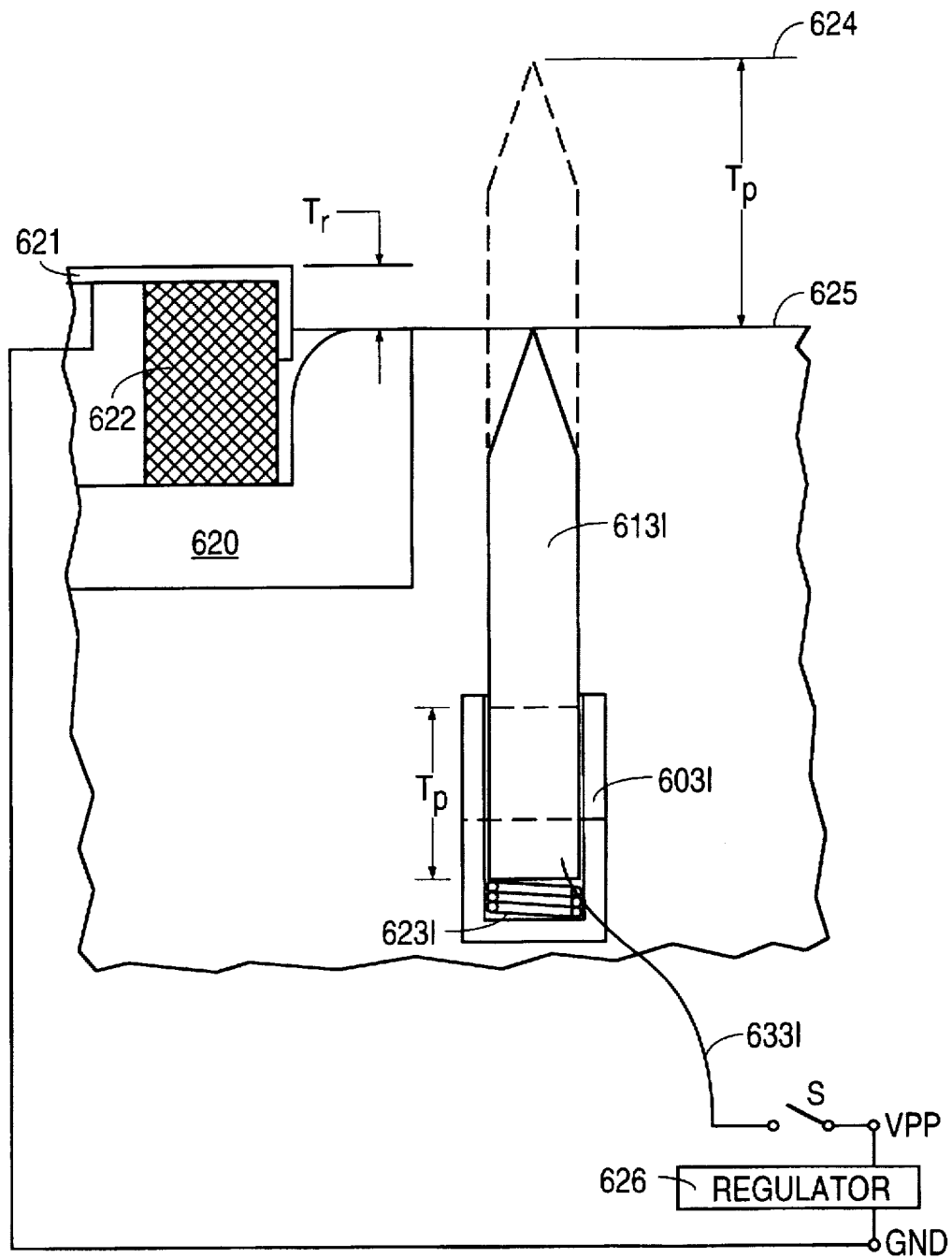

Referring back to FIG. 6A, each of tubes 601A–601V, 602A–602X, 603A–603Y and 604A–604W contains a probe and a spring, as illustrated in FIG. 6B. Specifically, tube 603I has a probe 613I that can translate between an extended position 624 and a retracted position 625. Initially, a spring 623I in tube 603I maintains probe 613I at the extended position 624. When a BGA package 210 is mounted on programming fixture 600, probe 613I makes contact with a corresponding ball attach pad (not shown in FIG. 6B) and retracts as necessary by a distance of up to Tp, in this embodiment of 0.070 inch.

Programming fixture 600 also includes a rubber ring 622 (of the same width as, for example, width W2 of cavity 225) that is mounted on a base 620. Ring 622 supports a conductive sheet 621, for example, a copper foil. Sheet 621 is connected to a source GND of ground reference voltage potential. When BGA package 210 is mounted on programming fixture 600, chip bonding pads 224A–224Q contact the conductive sheet 621 and are shorted to source GND. Conductive sheet 621 can translate through a distance Tr, for example, 0.020 inch in this embodiment, so that sheet 621 contacts each and every one of the chip bonding pads of a BGA package mounted on fixture 600.

When a switch S is closed between a source VPP of a programming voltage potential and probe 613I, a programming voltage is applied between a ball attach pad and a chip bonding pad of the mounted BGA package (not shown in FIGS. 6A and 6B), thereby passing a programming current through one or more micro filled vias in the electrical path between the two pads. In one embodiment, the programming voltage is between 1 volt and hundred volts, and the programming current is between 1 amp and 5 amps.

Programming fixture 600 has a regulator 626 that includes, for example, a solid state power metal oxide silicon field effect transistor (power MOSFET), to regulate and switch the programming voltage and current while programming and testing the mounted BGA package. Regulator 626 includes a resistance meter that measures the resistance of the electrical path, for example, after programming. In one embodiment, the target resistance of an electrical path after programming is predetermined to be in the range of 50 mΩ to 300 mΩ. If the measured resistance is not within the predetermined target range, the electrical path can be repeatedly programmed until a resistance within the target range is reached. If after programming a multiple number of times, for example, three times, the electrical path has resistance larger than the target range, programming can be aborted and the BGA package can be marked as a defective package.

In cavity up package 510 (FIG. 5A), a micro filled via material can be placed within thermal vias 560A–560K that are connected in parallel between regions 561 and 562. During programming thermal vias 560A–560K that contain the micro filled via material can be programmed without being individually addressed, by passing a higher current then the programming current for a single micro filled via. The higher current is split among the parallely connected thermal vias 560A–560K and the split current is sufficient to program each one of thermal vias 560A–560K.

In another embodiment, the thermal vias 560A–560K are not programmed, because these vias are inherently more conductive and reliable, due to their larger size and due to their redundancy with each other.

A BGA package can be tested, either before or after programming, with an open test and a short test. In the open test, chip bonding pads of the BGA package are shorted together to one node as described above for programming the micro filled vias, so that an open micro filled via causes an open electrical path between the respective ball attach pad and the chip bonding pad.

In the short test, all chip bonding pads of the BGA package are left unconnected, and the electrical path between any two ball attach pads is tested. If any two ball attach pads are found shorted, there is an abnormal electrical path, and so the BGA package is defective.

Although in one embodiment, the BGA package is completely devoid of glass fibers, in another embodiment, only those dielectric layers that contain micro filled vias are devoid of woven glass fibers, and the other dielectric layers in such IC package may or may not contain woven glass fibers.

In one embodiment, the BGA package is completely devoid of any BT core, and any support layers in the BGA package are formed of a polymeric dielectric material well known to those skilled in the art of BGA packaging. Therefore, such a BGA package can be formed completely devoid of any drilled holes, with one or more interconnections between a chip bonding pad and a ball attach pad being formed through a micro filled via described above.

The above description is illustrative only and not limiting. Other embodiments of this invention will be obvious to those skilled in the art in view of the disclosure. Various modifications and adaptations of this invention are encompassed by the accompanying claims.

We claim:

1. A package for supporting at least one integrated circuit chip, said package having a first outer surface and a second outer surface opposite said first outer surface, said package comprising:

a dielectric layer located between said first outer surface and said second outer surfaces said dielectric layer including a photoimageable material; a plurality of chip bonding pads supported by at least said dielectric layer and formed in a first predetermined configuration suitable for connection to a plurality of pads on said integrated circuit chip;

a plurality of ball attach pads supported by at least said dielectric layer and formed in a second predetermined configuration;

an electrical conductor formed at least in the center of a hole defined by said dielectric layer, said electrical conductor being part of an electrical path between one of said ball attach pads and one of said chip bonding pads; and a portion of an electrically conductive layer, said portion having a contiguous surface covering said hole, said contiguous surface being in contact with said electrical conductor.

2. The package of claim 1 wherein said electrical conductor comprises at least one conductive particle and a binding material.

3. The package of claim 2 wherein the resistance of said electrical conductor, after passage of a programming current through said conductive particle, is equal to or lower than the resistance of said electrical conductor before said passage.

4. The package of claim 2 wherein said binding material comprises a conductive polymer.

5. The package of claim 2 wherein said binding material comprises a nonconductive polymer.

6. The package of claim 1 wherein said portion has a substantially flat surface.

7. The package of claim 6 wherein said portion forms a trace.

8. The package of claim 6 wherein said portion forms one of said ball attach pads.

9. The package of claim 8 wherein said ball attach pad is substantially flat.

10. The package of claim 1 wherein said dielectric layer is devoid of woven glass fiber.

11. The package of claim 1 wherein said dielectric layer is devoid of drilled vias.

12. The package of claim 1 being devoid of BT core.

13. The package of claim 1 comprising a plurality of dielectric layers, each of said dielectric layers defining a hole, said package further comprising a plurality of electrical conductors formed at least in the center of the hole in each dielectric layer.

14. The package of claim 13 wherein at least two of said electrical conductors are substantially aligned with each other.

15. The package of claim 1 further comprising a plurality of traces formed in an inner layer, said inner layer being located between said first outer surface and said second outer surface, said inner layer being separated from said chip bonding pads by said dielectric layer, a trace of said plurality of traces being electrically connected to said electrical conductor, said trace being part of said electrical path.

16. The package of claim 15 further comprising a group of traces formed in a region of said first outer surface, the number of traces in said group being smaller than the number of traces in said plurality, each of said traces coupling one of said chip bonding pads to one of said ball attach pads.

17. The package of claim 1 further comprising an electrically conductive pattern formed in a region of said first outer surface, said pattern being formed in a predetermined configuration occupying an area completely surrounding each pad of a group of ball attach pads formed in said region, said region being predetermined for connection to a source of reference voltage.

18. The package of claim 17 wherein said group includes ball attach pads of at least one row.

19. The package of claim 17 wherein said group includes ball attach pads of a plurality of rows.

20. The package of claim 17 wherein said reference voltage is the ground reference voltage.

21. The package of claim 1 further comprising an electrically conductive pattern located between said first outer surface and said second outer surface, said pattern being formed in another predetermined configuration for connection to a power reference source.

22. The package of claim 1 further comprising a plurality of balls, each ball being attached to one of said ball attach pads.

23. The package of claim 1 wherein an electrically conductive path between said chip bonding pad and said ball attach pad consists essentially of said electrical conductor and a trace located between said first outer surface and said second outer surface.

24. The package of claim 1 further comprising a second electrical conductor formed in a second hole defined by said dielectric layer, wherein an electrically conductive path between said chip bonding pad and said ball attach pad consists essentially of said electrical conductor, a trace located between said first outer surface and said second outer surface, and said second electrical conductor.

25. The package of claim 1 further comprising a stiffener, wherein said stiffener supports said dielectric layer.

26. The package of claim 25 wherein a trace couples said chip bonding pad and said ball attach pad, said trace being located between said dielectric layer and said stiffener.

27. The package of claim 25 further comprising a heat sink, wherein said heat sink supports said stiffener.

28. A cavity up substrate for supporting at least one integrated circuit chip, said substrate having an exposed side and a contact side, said substrate comprising:
 a first dielectric layer located between said contact side and said exposed side, said first dielectric layer including a photoimageable material;
 a second dielectric layer located between said contact side and said exposed side;
 a plurality of chip bonding pads supported by at least said first dielectric layer and formed on said exposed side in a first predetermined configuration suitable for connection to a plurality of pads on said integrated circuit chip;
 a plurality of ball attach pads supported by at least said second dielectric layer and formed on said contact side in a second predetermined configuration;
 an electrical conductor formed at least in the center of a hole defined by said first dielectric layer, said electrical conductor being part of an electrical path between one of said ball attach pads and one of said chip bonding pads; and
 a plated via formed in a hole defined by said second dielectric layer, said plated via being part of said electrical path.

29. The substrate of claim 28 wherein said electrical path consists essentially of said electrical conductor and said plated via.

30. The substrate of claim 28 wherein said electrical conductor in said dielectric layer has a diameter less than half the diameter of said plated via.

31. The substrate of claim 28 wherein said electrical conductor comprises a plurality of conductive particles, at least two of said conductive particles being in contact with each other.

32. The substrate of claim 28 having no more than one trace between two adjacent chip bonding pads.

33. A cavity down substrate for supporting at least one integrated circuit chip, said substrate having a contact side and an exposed side opposite said contact side, said substrate comprising:
 a dielectric layer located between said contact side and said exposed side, said dielectric layer including a photoimageable material;
 a plurality of chip bonding pads supported by at least said dielectric layer and formed on said contact side in a first predetermined configuration suitable for connection to a plurality of pads on said integrated circuit chip;
 a plurality of ball attach pads supported by at least said dielectric layer and formed on said contact side in a second predetermined configuration;
 an electrical conductor formed at least in the center of a hole defined by said dielectric layer, said electrical conductor being part of an electrical path between one of said ball attach pads and one of said chip bonding pads; and
 a portion of an electrically conductive layer, said portion having a contiguous surface in contact with said electrical conductor, said contiguous surface covering said hole.

34. The substrate of claim 33 wherein said electrical conductor in said dielectric layer comprises a plurality of conductive particles, at least two of said conductive particles being in contact with each other.

35. The substrate of claim 33 having no more than one trace between two adjacent chip bonding pads.

36. A substrate for supporting at least one integrated circuit chip, said substrate having a first outer surface and a second outer surface opposite said first outer surface, said substrate comprising:
 a dielectric layer located between said first outer surface and said second outer surface, said dielectric layer including a photoimageable material;
 a plurality of chip bonding pads supported by at least said dielectric layer, a first group of said chip bonding pads being formed in a first plane, and a second group of said chip bonding pads being formed in a second plane;
 a plurality of ball attach pads supported by at least said dielectric layer;
 an electrical conductor formed at least in the center of a hole defined by said dielectric layer, said electrical conductor being part of an electrical path between a chip bonding pad in said first plane and one of said ball attach pads; and
 a portion of an electrically conductive layer, said portion having a contiguous surface in contact with said electrical conductor.

37. The substrate of claim 36 wherein all chip bonding pads in said second group are connected by traces in said second plane to a corresponding number of said ball attach pads.

38. The substrate of claim 36 wherein each chip bonding pad in said first group is coupled through an electrical conductor formed in the center of a hole defined by said dielectric layer to one of said ball attach pads.

* * * * *